US012812836B2

(12) United States Patent
Ramaswamy et al.

(10) Patent No.: US 12,812,836 B2
(45) Date of Patent: Nov. 24, 2026

(54) MEMORY DEVICE HAVING 2-TRANSISTOR VERTICAL MEMORY CELL AND SEPARATE READ AND WRITE DATA LINES

(71) Applicant: Micron Technology, Inc., Boise, ID (US)

(72) Inventors: Durai Vishak Nirmal Ramaswamy, Boise, ID (US); Karthik Sarpatwari, Boise, ID (US); Kamal M. Karda, Boise, ID (US); Pankaj Sharma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 440 days.

(21) Appl. No.: 18/238,269

(22) Filed: Aug. 25, 2023

(65) Prior Publication Data

US 2024/0074138 A1 Feb. 29, 2024

Related U.S. Application Data

(60) Provisional application No. 63/373,930, filed on Aug. 30, 2022.

(51) Int. Cl.
*H10B 12/00* (2023.01)

(52) U.S. Cl.
CPC .................................... *H10B 12/00* (2023.02)

(58) Field of Classification Search
CPC .... H10B 12/00; H10B 12/482; H10B 12/488; H10B 10/00–18; H10B 43/00–50; G11C 11/403; G11C 11/41–419; G11C 27/005; H10D 30/6755
See application file for complete search history.

(56) References Cited

U.S. PATENT DOCUMENTS

2020/0211602 A1* 7/2020 Karda .................. H10D 30/689
2020/0211615 A1* 7/2020 Sarpatwari .......... G11C 11/4023

FOREIGN PATENT DOCUMENTS

KR 20040076554 A * 9/2004 ......... H10N 70/8828

* cited by examiner

*Primary Examiner* — Shahed Ahmed
(74) *Attorney, Agent, or Firm* — Schwegman Lundberg & Woessner, P.A.

(57) ABSTRACT

Some embodiments include apparatuses and methods of forming the apparatuses. One of the apparatuses includes a first data line; a second data line adjacent the first data line and separated from the first data line by a first dielectric structure; and a memory cell formed over the first and second data lines. The memory cell includes a first transistor including a first channel region formed over and coupled to the first data line, and a charge storage structure separated from the first channel region; a second transistor including a second channel region formed over and coupled to the second data line, wherein the charge storage structure is formed over and coupled to the second channel region; and a second dielectric structure between the first channel region and each of the second channel region and the charge storage structure.

17 Claims, 32 Drawing Sheets

200

200

200

200

200

200

200

200

200

200

200

200

200

200

MEMORY DEVICE HAVING 2-TRANSISTOR VERTICAL MEMORY CELL AND SEPARATE READ AND WRITE DATA LINES

PRIORITY APPLICATION

This application claims the benefit of priority to U.S. Provisional Application Ser. No. 63/373,930, filed Aug. 30, 2022, which is incorporated herein by reference in its entirety.

BACKGROUND

Memory devices are widely used in computers and many other electronic items to store information. Memory devices are generally categorized into two types: volatile memory devices and non-volatile memory devices. A memory device usually has numerous memory cells in which to store information. In a volatile memory device, information stored in the memory cells is lost if the power supply is disconnected from the memory device. In a non-volatile memory device, information stored in the memory cells is retained even if the supply power is disconnected from the memory device.

The description herein involves volatile memory devices. Some conventional volatile memory devices store information in the form of a charge in a capacitor structure. Some other conventional volatile memory devices may use non-capacitor structures to store information and may employ techniques that use a single data line associated with a memory cell for both read and write operations performed on the memory cell. However, such techniques in some of those memory devices are susceptible to background leakage of current that can lead to unreliable memory operations.

DETAILED DESCRIPTION

The techniques described herein involve a memory device having memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size (e.g., footprint) of the memory device to be relatively smaller than the size (e.g., footprint) of similar conventional memory devices. The described memory device can include a single access line (e.g., word line) to control two transistors of a corresponding memory cell. This can lead to reduced power dissipation and improved processing. Each of the memory cells of the described memory device can include a cross-point gain cell structure (and cross-point operation), such that a memory cell can be accessed using a single access line (e.g., word line). Each memory cell of the described memory device is associated with separate read and write data lines (e.g., bit lines) for read and write operations, respectively. Separate data lines for read and write operations can improve electrical separation between the transistors of the memory cell. This can reduce or prevent background leakage. As a result, improvement (e.g., increased reliability) in memory operations (e.g., read and write operations) of the described memory device can be achieved. Further, the data lines and other memory cell structures of the described memory device have a relatively compact structure. This can improve device scaling and reduce the size of the memory device. Other improvements and benefits of the described memory device and its variations are discussed below with reference to FIG. 1 through FIG. 29C.

Figure 1:
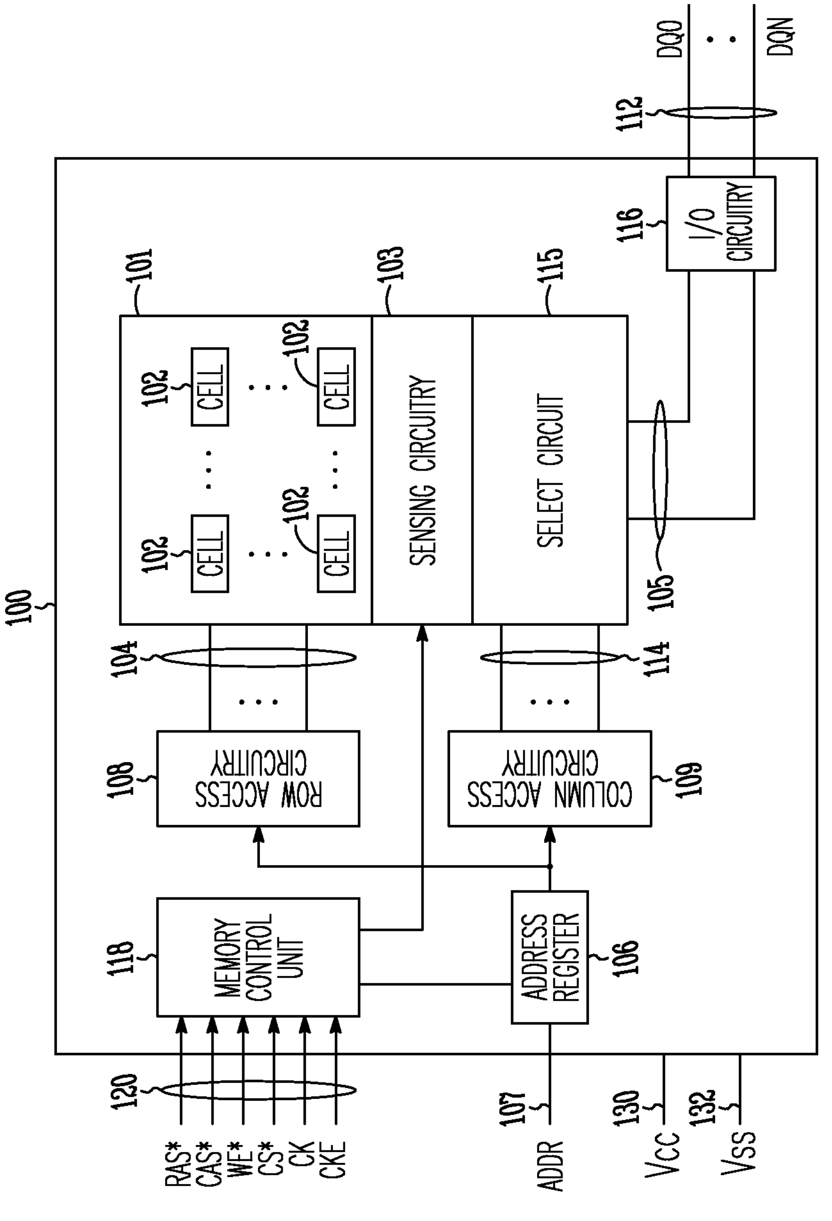
FIG. 1 shows a block diagram of an apparatus in the form of a memory device including memory cells, according to some embodiments described herein.

FIG. 1 shows a block diagram of an apparatus in the form of a memory device 100 including memory cells that can be volatile memory cells, according to some embodiments described herein. Memory device 100 includes a memory array 101, which can contain memory cells 102. Memory device 100 can include a memory device such that memory cells 102 can be volatile memory cells. An example of memory device 100 includes a dynamic random-access memory (DRAM) device. Information stored in memory cells 102 of memory device 100 may be lost (e.g., invalid) if the power supply (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 25C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 25C.

Figure 2:
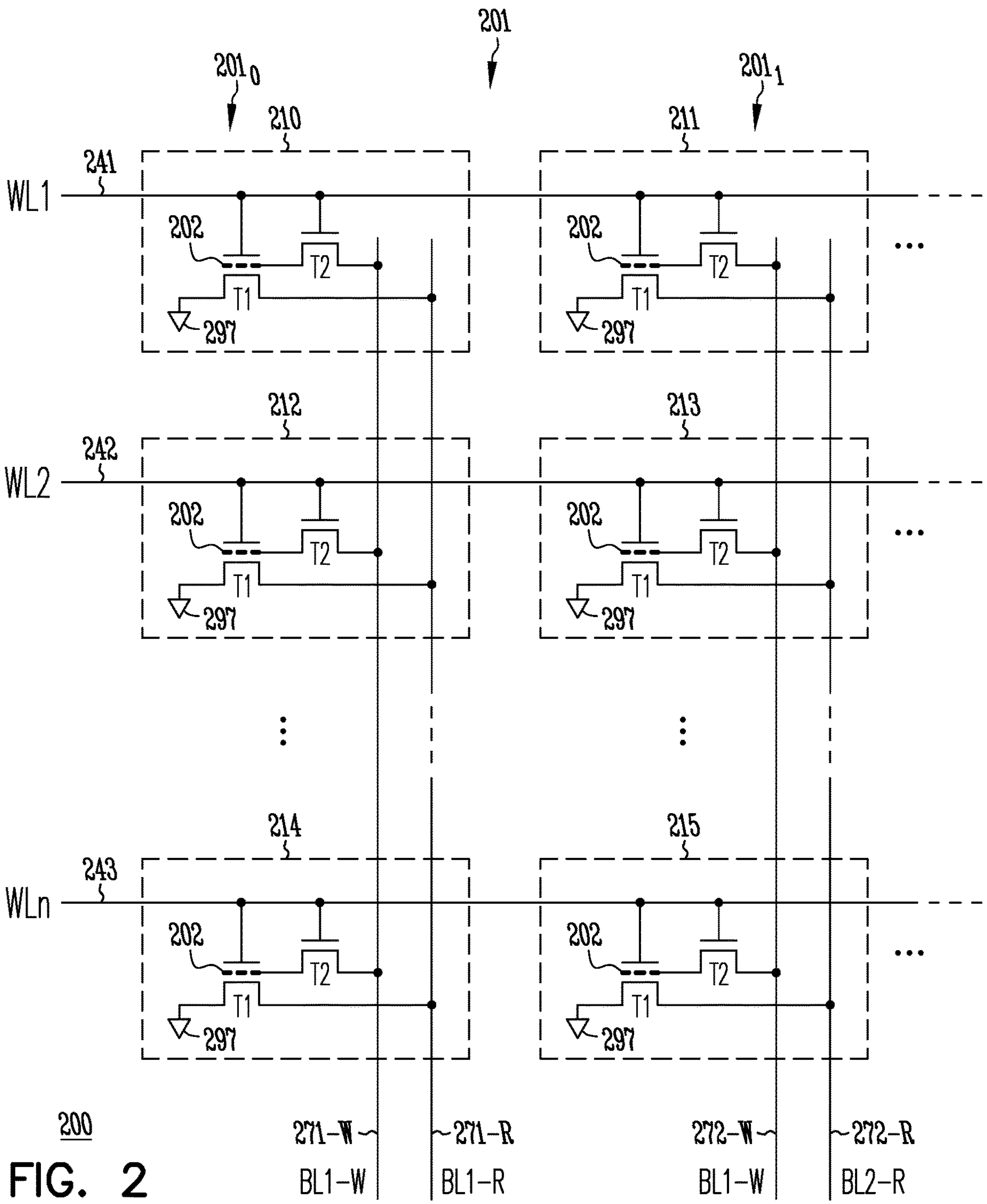
FIG. 2 shows a schematic diagram of a portion of a memory device including a memory array of two-transistor (2T) memory cells and read and write data lines, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which can be volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor. Thus, transistor T1 can include an operation similar to that of a PMOS transistor. Part of transistor T2 can include an n-channel metal-oxide semiconductor (NMOS). Thus, transistor T2 can include an operation similar to that of a NMOS transistor.

Transistor T1 of memory device 200 can include a charge-storage based structure (e.g., a floating-gate based structure). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell. For example, the value of information stored in a particular memory cell among memory cells 210 through 215 can be "0" or "1" (if each memory cell is configured as a single-bit memory cell) or "00", "01", "10", "11" (or other multi-bit values) if each memory cell is configured as a multi-bit memory cell.

As shown in FIG. 2, transistor T2 (e.g., the channel region of transistor T2) of a particular memory cell among memory cells 210 through 215 can be electrically coupled to (e.g., directly coupled to (contact)) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200. During a write operation of memory device 200, a circuit path (e.g., current path) can be formed between a respective data line (e.g., data line 271-W or 272-W) and charge storage structure 202 of a particular memory cell through transistor T2 (e.g., through the channel region of transistor T2) of the particular memory cell.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1.

Memory device 200 can include separate data lines (e.g., read and write data lines) for read and write operations, respectively. As shown in FIG. 2, memory device 200 can include data lines (e.g., read bit lines) 271-R and 272-R that can carry respective signals (e.g., read bit line signals) BL1-R and BL2-R. Memory device 200 can include data lines (e.g., write bit lines) 271-W and 272-W that can carry respective signals (e.g., write bit line signals) BL1-W and BL2-W. Each of data lines 271-R, 272-R, 271-W, and 272-W can be structured as a conductive line. During a read operation, memory device 200 can use data lines 271-R to obtain information read (e.g., sense) from a selected memory cell (e.g., target memory cell) of memory cell group $201_0$, and data lines 272-R to obtain information read (e.g., sense) from a selected memory cell of memory cell group $201_1$. During a write operation, memory device 200 can use data line 271-W to provide information to be stored in a selected memory cell (e.g., target memory cell) of memory cell group $201_0$, and data line 272-W to provide information to be stored in a selected memory cell of memory cell group $201_1$.

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. In the physical structure of memory device 200, each of access lines 241, 242, and 243 can be structured as (can be formed from) at least one conductive line (one conductive line or multiple conductive lines where the multiple conductive lines can be electrically coupled (e.g., shorted) to each other).

Access lines 241, 242, and 243 can be selectively activated (e.g., activated one at a time) during an operation (e.g., read or write operation) of memory device 200 to access a selected memory cell (or selected memory cells) among memory cells 210 through 215. A selected memory cell can be referred to as a target memory cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Alternatively, two separate access lines can be used to control respective transistors T1 and T2 during an access to a respective memory cell during a read operation or a write operation. However, using a single access line (e.g., shared access line) in memory device 200 to control both transistors T1 and T2 of a respective memory cell in a read operation or a write operation can save space and simplify operation of memory device 200.

In memory device 200, the gate (not labeled in FIG. 2) of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the physical structure of memory device 200, four different portions of a conductive material (e.g., four different portions of continuous piece of metal or polysilicon) that forms access line 241 can form the gates (e.g., four gates) of transistors T1 and T2 of memory cell 210 and the gates of transistors T1 and T2 of memory cell 211, respectively.

In a similar structure as transistors T1 and T2 of memory cells 210 and 211, the gate of each of transistors T1 and T2 of memory cells 212 and 213 can be part of access line 242. For example, in the structure of memory device 200, four different portions of a conductive material (e.g., four different portions of continuous piece of metal or polysilicon) that form access line 242 can form the gates (e.g., four gates) of transistors T1 and T2 of memory cell 212 and the gates of transistors T1 and T2 of memory cell 213, respectively.

The gate of each of transistors T1 and T2 of memory cells 214 and 215 can be part of access line 243. For example, in the structure of memory device 200, four different portions of a conductive material (e.g., four different portions of continuous piece of metal or polysilicon) that form access line 243 can form the gates (e.g., four gates) of transistors T1 and T2 of memory cell 214 and the gates of transistors T1 and T2 of memory cell 215, respectively.

In this description, a material can include a single material or a combination of multiple materials. A conductive material can include a single conductive material or combination of multiple conductive materials.

Memory device 200 can include a ground connection (e.g., ground plate) 297 coupled to each of memory cells 210 through 215. Ground connection 297 can be structured from a conductive plate that can be coupled to a ground terminal of memory device 200.

Figure 6:
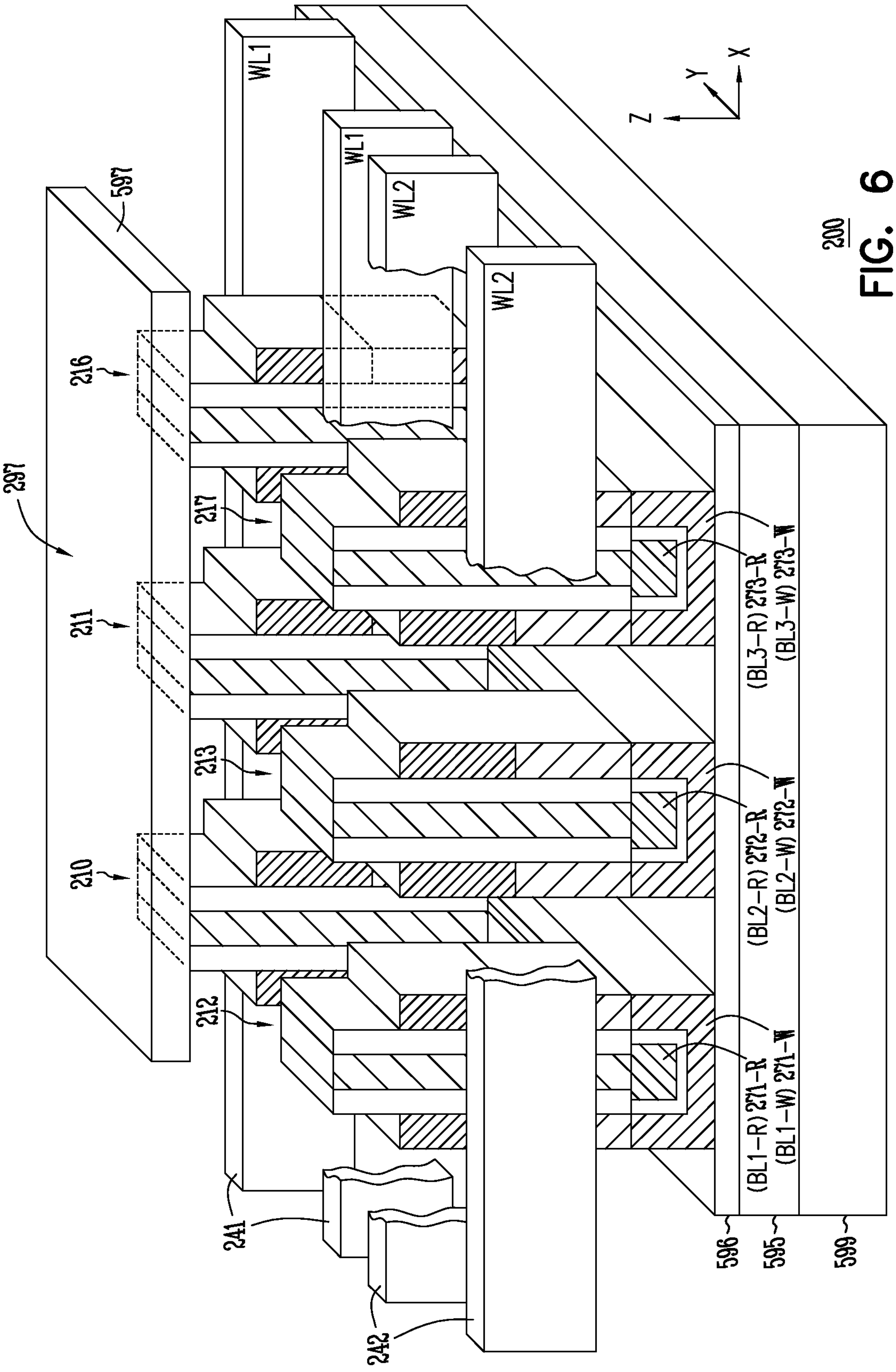

As an example (e.g., shown in FIG. 6), ground connection 297 can be part of a common conductive structure (e.g., a common conductive plate) that can be formed on a level of memory device 200. The level can be located over (above) the memory cells (e.g., memory cells 210 through 215) of memory device 200. In this example (as shown in FIG. 6), the elements (e.g., part of transistors T1 and T2 or the entire transistors T1 and T2) of each of the memory cells (e.g., memory cells 210 through 215) of memory device 200 can be formed (e.g., formed vertically) under (below) the common conductive structure (e.g., a common conductive plate) and electrically coupled to the common conductive structure. In another example (not shown in FIG. 6), ground connection 297 can be part of separate conductive structures (e.g., separate conductive strips) instead of a single structure (e.g., single conductive plate).

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., read data line) 271-R or 272-R). Thus, a circuit path (e.g., current path) can be formed between a respective data line 271-R or 272-R and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 271-R, and ground connection 297. In memory cell group $201_1$, a read path of a particular memory cell (e.g., memory cell 211, 213, or 215) can include a current path (e.g., read current path) through a channel region of transistor T1 of that particular memory cell, data line 272-R, and ground connection 297. In the example where transistor T1 is a PFET (e.g., a PMOS), the current in the read path (e.g., during a read operation) can include a hole conduction (e.g., hole conduction in the direction from data line 271-R to ground connection 297 through the channel region (e.g., p-channel region) of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 271-W. In memory cell group $201_1$, a write path of a particular memory cell (e.g., memory cell 211, 213, or 215) can include transistor T2 (e.g., can include a write current path through a channel region of transistor T2) of that particular memory cell and data line 272-W. In the example where transistor T2 is an NFET (e.g., NMOS), the current in a write path (e.g., during a write operation) can include an electron conduction (e.g., electron conduction in the direction from a respective data line (e.g., write data line) 271-W or 272-W to charge storage structure 202 through the channel region (e.g., n-channel region) of a respective transistor T2. Since transistor T2 can be used in a write path to store information in a respective memory cell during a write operation, transistor T2 can be called a write transistor and the channel region of transistor T2 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1," where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 for state "0"<Vt1 for state "1," where Vt1 for state "0"=0V (or alternatively Vt1 for state "0">0V), and Vt1<Vt2.

During a read operation of memory device 200, only one memory cell of the same memory cell group can be selected at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 271-R, transistor T1 of the selected memory cell (e.g., memory cell 210, 212, or 214), and ground connection 297. The value of information read from the selected memory cell of memory cell group $201_1$ during a read operation can be determined based on the value of a current detected (e.g., sensed) from a read path that includes data line 272-R, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 271-R, and detect a current (e.g., current I2, not shown) on a read path that includes data line 272-R. The value of the detected current can be based on the value of information stored in the selected memory cell. For example, depending on the value of information stored in the selected memory cell of memory cell group $201_0$, the value of the detected current (e.g., the value of current I1) on data line 271-R can be zero or greater than zero. Similarly, depending on the value of information stored in the selected memory cell of memory cell group $201_1$, the value of the detected current (e.g., the value of current I2) on data line 272-R can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 271-W and transistor T2 of the selected memory cell (e.g., memory cell 210, 212, or 214). Information to be stored in a selected memory cell of memory cell group $201_1$ during a write operation can be provided through a write path (described above) that includes data line 272-W and transistor T2 of the selected memory cell (e.g., memory cell 211, 213, or 215). As described above, the value (e.g., binary value) of information stored in a particular memory cell among memory cells 210 through 215 can be based on the amount of charge in the charge storage structure 202 of that particular memory cell.

In a write operation, the amount of charge in the charge storage structure 202 of a selected memory cell can be changed (to reflect the value of information stored in the selected memory cell) by applying a voltage on a write path that includes transistor T2 of that particular memory cell and the data line (e.g., data line 271-W or 272-W) coupled to that particular memory cell. For example, a voltage having one value (e.g., 0V) can be applied on data line 271-W (e.g., provide 0V to signal BL1-W) if information to be stored in a selected memory cell among memory cells 210, 212, and 214 has one value (e.g., "0"). In another example, a voltage having another value (e.g., a positive voltage) can be applied on data line 271-W (e.g., provide a positive voltage to signal BL1-W) if information to be stored in a selected memory cell among memory cells 210, 212, and 214 has another value (e.g., "1"). Thus, information can be stored (e.g., directly stored) in the charge storage structure 202 of a particular memory cell by providing the information to be stored (e.g., in the form of a voltage) on a write path (that includes transistor T2) of that particular memory cell.

Figure 3:
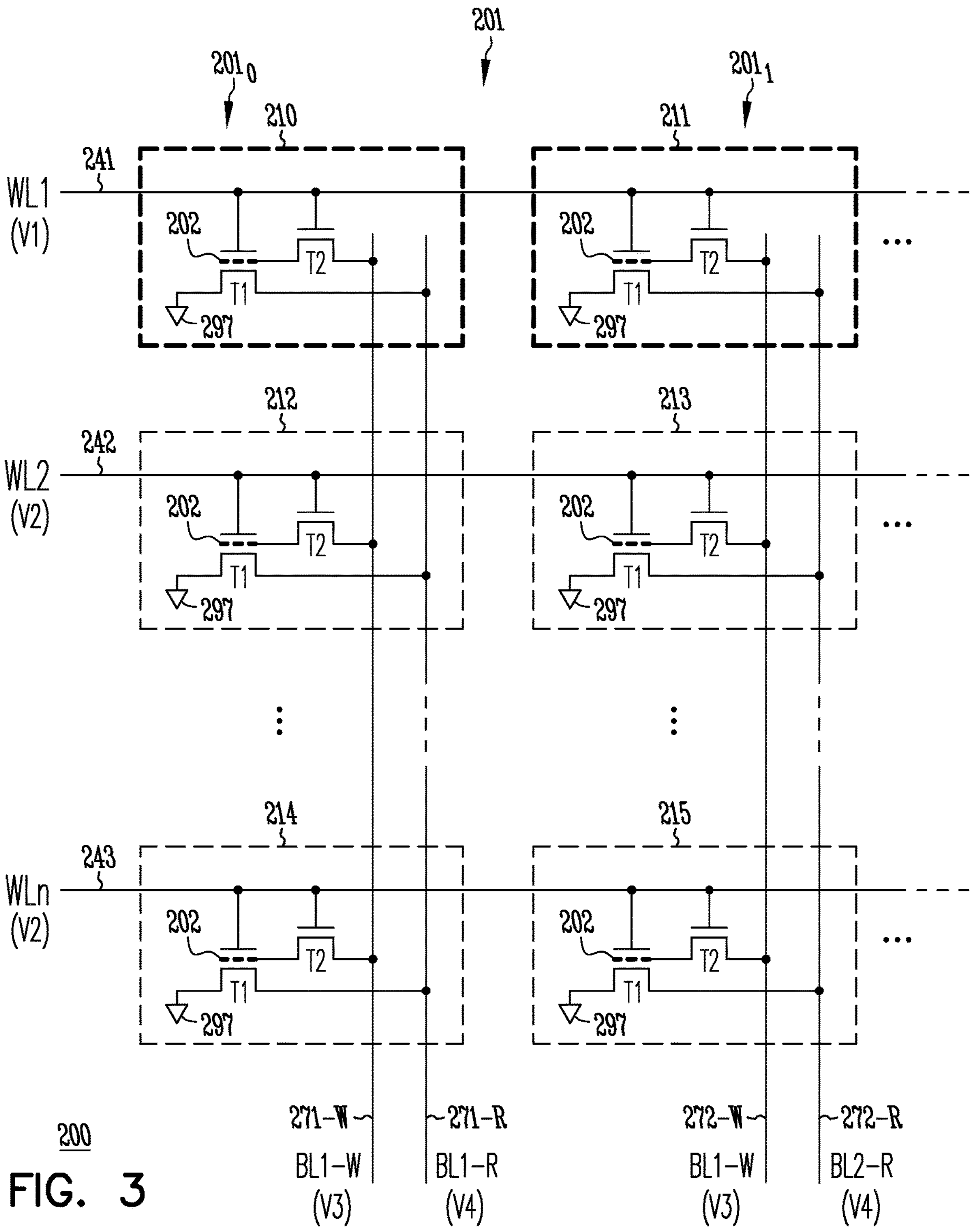
FIG. 3 shows the memory device of FIG. 2, including example voltages used during a read operation of the memory device, according to some embodiments described herein.

FIG. 3 shows memory device 200 of FIG. 2 including example voltages V1, V2, V3, and V4 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3. In this example, access line 241 can be called a selected access line (e.g., selected word line), which is the access line associated with (e.g., coupled to) selected memory cells (e.g., memory cells 210 and 211 in this example). In this example, access lines 242 and 243 can be called unselected access lines (e.g., unselected word line), which are the access lines associated with (e.g., coupled to) unselected memory cells (e.g., memory cells 212, 213, 214, and 215 in this example).

In FIG. 3, voltages V1, V2, V3, and V4 can represent different voltages applied to respective access lines 241, 242, and 243 and data lines 271-R. 271-W, 272-R, and 272-W during a read operation of memory device 200. Voltage V1 can be applied to the selected access line (e.g., access line 241). In a read operation, voltage V2 can be applied to the unselected access lines (e.g., access lines 242 and 243).

Voltages V1, V2, V3, and V4 can have different values. As an example, voltages V1, V2, V3, and V4 can have values −1V, 0V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltages V2 and V3 can have respective values such that transistors T1 and T2 of each of memory cells 212 through 215 (unselected memory cells in this example) are turned off (e.g., kept off).

Voltage V4 can have a value such that a current (e.g., read current) may be formed on a read path that includes data line 271-R and transistor T1 of memory cell 210, and a read path (a separate read path) that includes data line 272-R and transistor T1 of memory cell 212. This allows a detection of current on the read paths (e.g., on respective data lines 271-R and 272-R) coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 271-R and 272-R can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 271-R (through transistor T1 of memory cell 210). In this example, transistor T1 of memory cell 211 can also turn on and conduct a current on data line 272-R (through transistor T1 of memory cell 211). Memory device 200 can determine the value of information stored in memory cells 210 and 211 based on the value of the currents on data lines 271-R and 272-R, respectively. As described above, memory device 200 can include detection circuitry to measure the value of currents on data lines 271-R and 272-R during a read operation.

Figure 4:
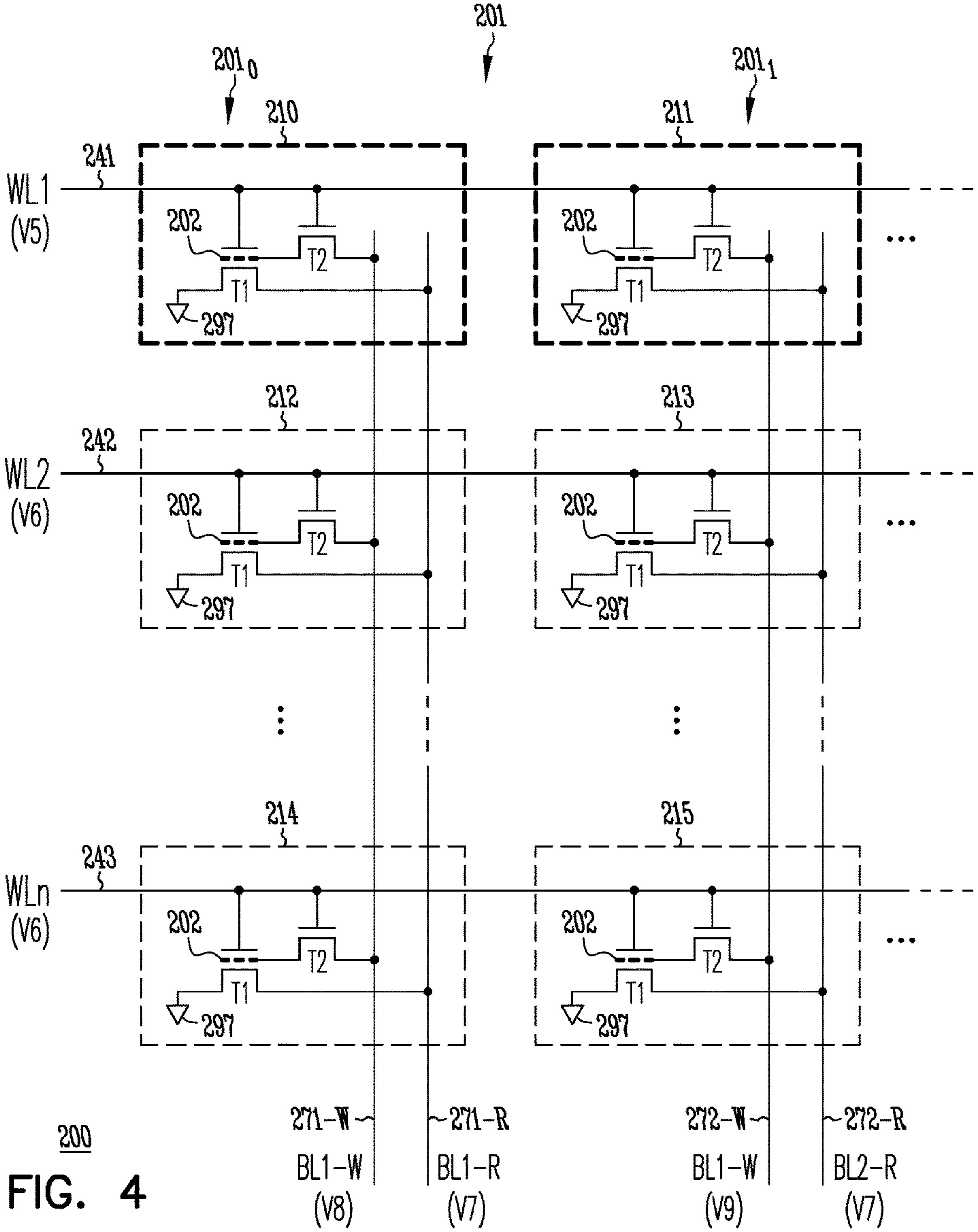
FIG. 4 shows the memory device of FIG. 2, including example voltages used during a write operation of the memory device, according to some embodiments described herein.

FIG. 4 shows memory device 200 of FIG. 2 including example voltages V5, V6, V7, V8, and V9 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V5, V6, V7, V8, and V9 can represent different voltages applied to respective access lines 241, 242, and 243 and data lines data lines 271-R. 271-W, 272-R, and 272-W during a write operation of memory device 200. In a write operation, voltage V5 can be applied to the selected access line (e.g., access line 241). Voltage V6 can be applied to the unselected access lines (e.g., access lines 242 and 243).

Voltages V5, V6, V7, V8, and V9 can have different values. As an example, voltages V5, V6, and V7 can have values of 2V, 0V, and 0V, respectively. These values are example values. Values different from these may be used.

The values of voltages V8 and V9 can be the same or different depending on the value (e.g., "0" or "1") of information to be stored in memory cells 210 and 211. For example, the values of voltages V8 and V9 can be the same (e.g., V8=V9) if the memory cells 210 and 211 are to store information having the same value. As an example, V8=V9=0V if information to be stored in each memory cell 210 and 211 is "0". In another example, V8=V9=V+ (e.g., V+ is a positive voltage (e.g., from 1V to 2V)) if information to be stored in each memory cell 210 and 211 is "1".

In another example, the values of voltages V8 and V9 can be different (e.g., V8≠V9) if the memory cells 210 and 211 are to store information having different values. As an example, V8=0V if "0" is to be stored in memory cell 210, and V9=V+ (e.g., V+ is a positive voltage (e.g., from 1V to 2V)) if "1" is to be stored in memory cell 211. As another example, V8=V+(e.g., V+ is a positive voltage (e.g., from 1V to 2V)) if "1" is to be stored in memory cell 210, and V9=0V if "0" is to be stored in memory cell 211.

The range of voltage of 1V to 2V is used here as an example. A different range of voltages can be used. Further, instead of applying 0V (e.g., V8=0V or V9=0V) to a particular write data line (e.g., data line 271-W or 272-W) for storing information having a value of "0" to the memory cell (e.g., memory cell 210 or 211) coupled to that particular write data line, a positive voltage (e.g., V8>0V or V9>0V) may be applied to that particular data line.

In a write operation of memory device 200 of FIG. 4, voltage V6 can have a value (e.g., V6=0V or V6<0V), such that transistors T1 and T2 of each of memory cells 212 through 215 (unselected memory cells, in this example) are turned off (e.g., kept off). Voltage V5 can have a value (e.g., V5>0V) to turn on transistor T2 of each of memory cells 210 and 211 (selected memory cells in this example) and form a write path between charge storage structure 202 of memory cell 210 and data line 271-W, and a write path between charge storage structure 202 of memory cell 211 and data line 272-W. A current (e.g., write current) may be formed between charge storage structure 202 of memory cell 210 (selected memory cell) and data line 271-W. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 272-W. This current can affect (e.g., change) the amount of charge on charge storage structure 202 of memory cell 211 to reflect the value of information to be stored in memory cell 211.

In the example write operation of FIG. 4, the value of voltage V8 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V9 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Including two data lines (e.g., data line 271-R and data line 271-W in FIG. 2) associated with a memory cell (e.g., memory cell 210 in FIG. 2) can improve memory operations (e.g., read or write operations) of memory device 200. For example, in a memory device in which read and write operations share a single data line (e.g., bit line), an unselected access line (e.g., word line) and a selected data line can contribute to background leakage (leakage of current). This can impact (e.g., degrade) memory operations. In memory device 200, separate data lines for read and write operations can improve electrical separation between transistors T1 and T2 of the memory cell. This can reduce or prevent background leakage, leading to an improvement (e.g., increased the reliability) in memory operations (e.g., read and write operations) of memory device 200.

FIG. 5A through FIG. 9 show different views of a structure of memory device 200 of FIG. 2 with respect to the X, Y, and Z directions, according to some embodiments described herein. For simplicity, cross-sectional lines (e.g., hatch lines) are omitted from most of the elements shown in FIG. 5A through FIG. 9 and other figures (e.g., FIG. 10 through FIG. 28) in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

Figure 5A:
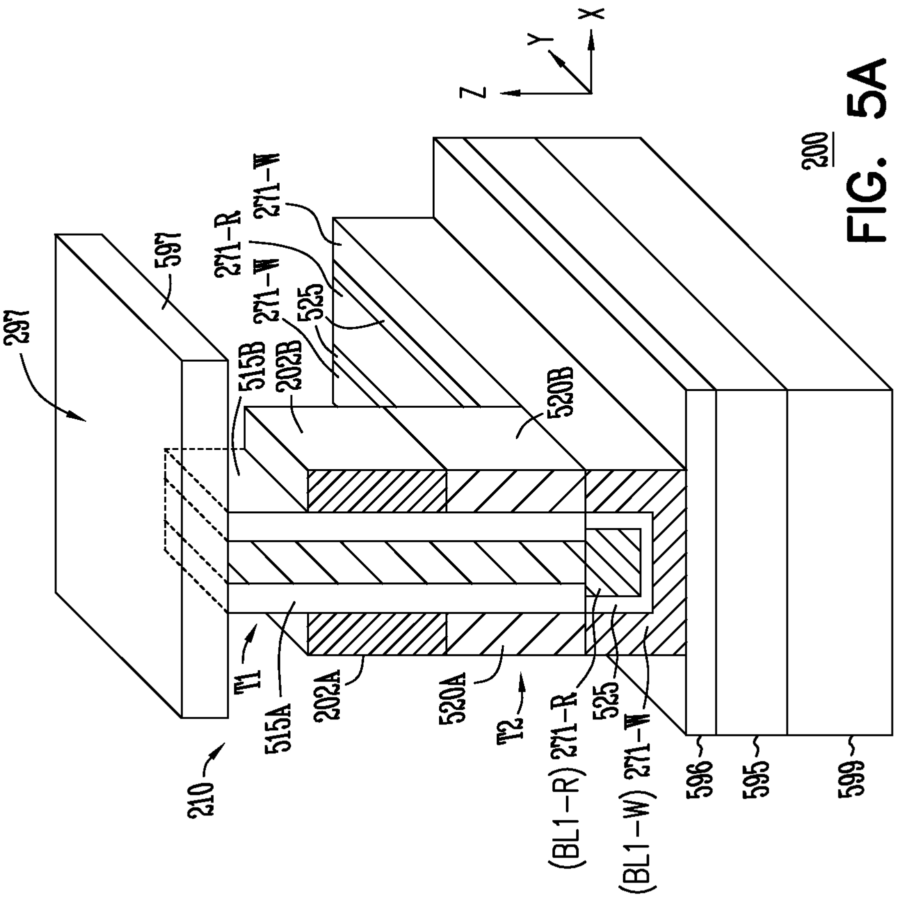
FIG. 5A through FIG. 9 show different views of a structure of the memory device of FIG. 2, according to some embodiments described herein.
Figure 5B:
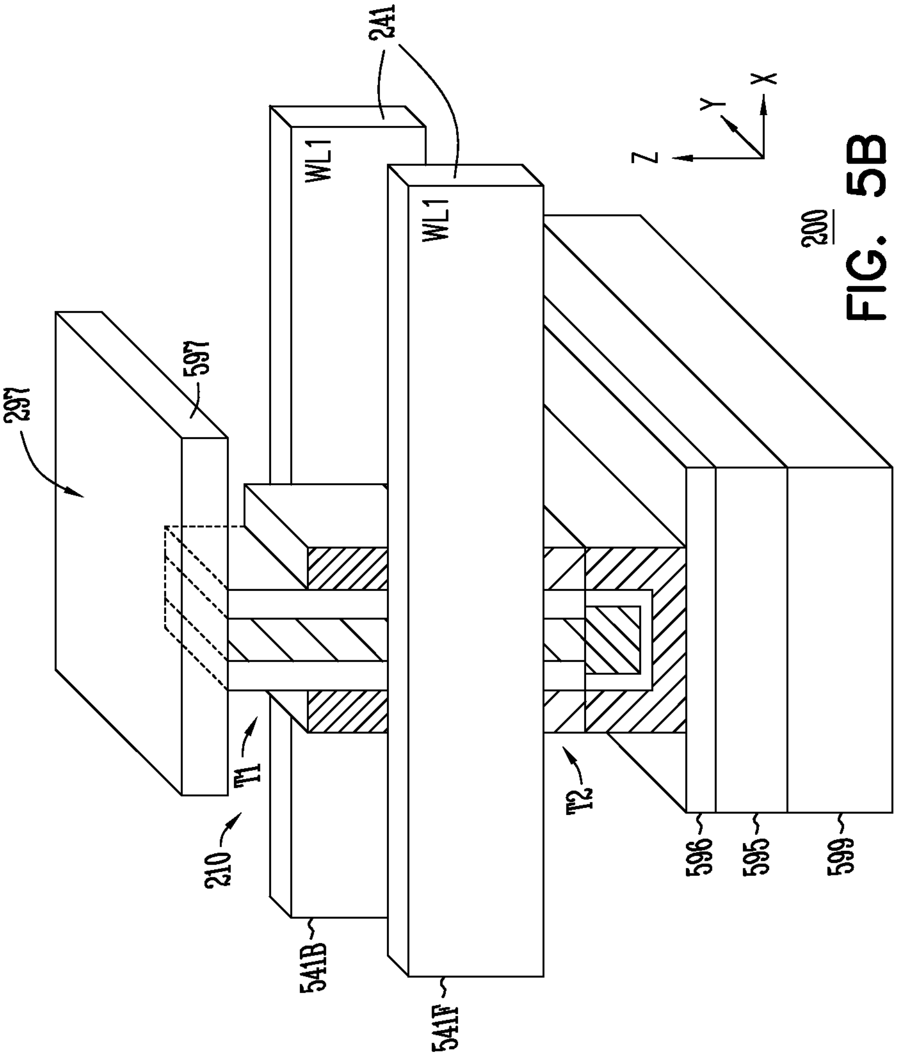
Figure 7:
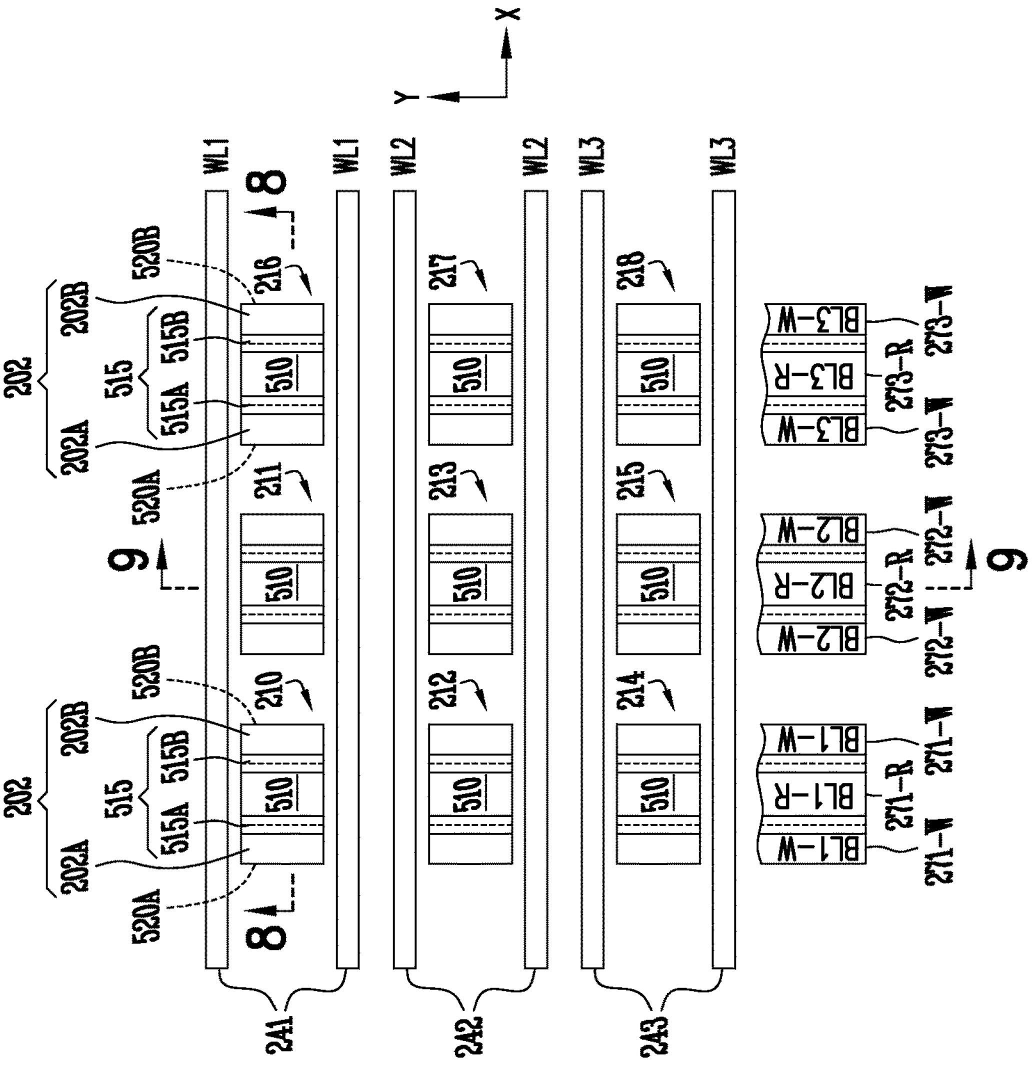
Figure 8:
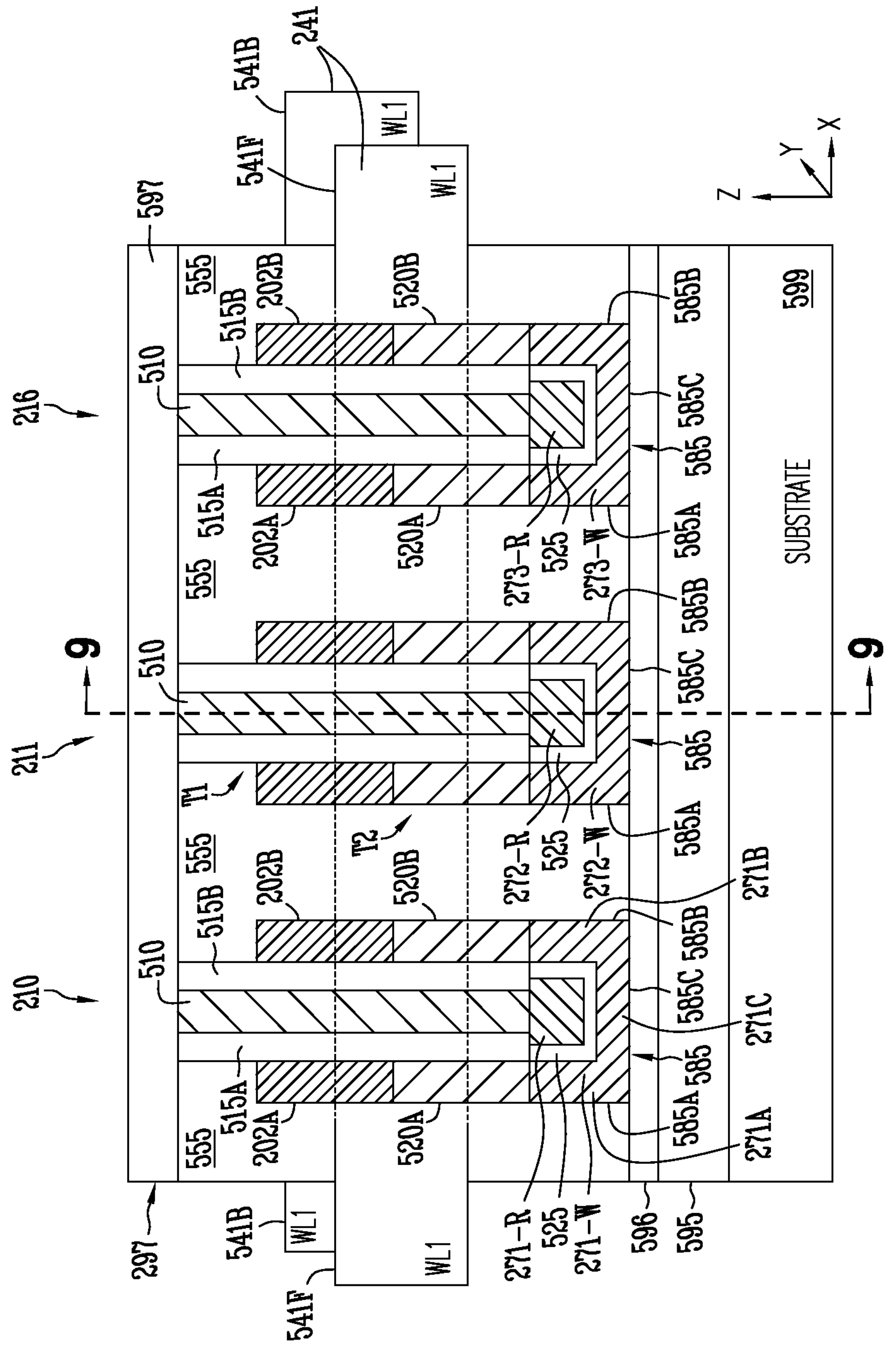
Figure 9:
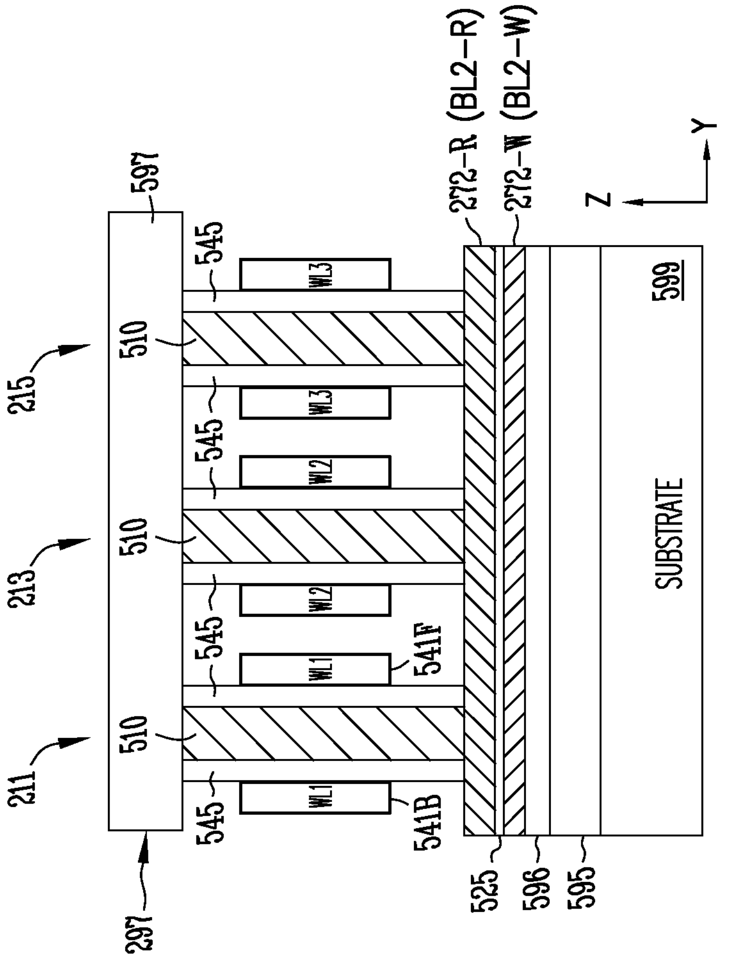

FIG. 5A, FIG. 5B, and FIG. 6 show different three-dimensional (3D) views (e.g., isometric views) of memory device 200 including the structures of memory cells 210, 211, 212, 213, 216, and 217 and data lines 271-R, 271-W, 272-R, 272-W, 273-R, and 273-W with respect to the X, Y, and Z directions. FIG. 7 shows a top view (e.g., plan view) of memory device 200 of FIG. 2 including relative locations of data lines 271-R, 271-W, 272-R, 272-W, 273-R, and 273-W (and associated signals BL1-R, BL1-W, BL2-R, BL2-W, BL3-R, and BL3-W), and access lines 241, 242, and 243 (associated signals WL1, WL2, and WL3). Memory cells 216, 217, and 218 associated data line 273-R and 273-W in FIG. 7 are not schematically shown in FIG. 2. FIG. 8 shows a side view (e.g., cross-sectional view in the X-Z directions) taken along line 8-8 of memory device 200 of FIG. 7 including memory cells 210, 211, and 216. FIG. 9 shows a view (e.g., cross-sectional view in the Y-Z directions) taken along line 9-9 of memory device 200 of FIG. 7 including memory cells 211, 213, and 215 of FIG. 7.

The following description refers to FIG. 5A through FIG. 9. FIG. 5A and FIG. 5B show the same memory cell 210 of memory device 200. However, to avoid crowding the structure of memory cell 210 of FIG. 5A, the structure of access line 241 in FIG. 5B is omitted from FIG. 5A. Some of the labels in FIG. 5A are also omitted from FIG. 5B for simplicity. The structures of other memory cells (e.g., memory cells 211 through 218 (FIG. 7) of memory device 200 can be similar to or the same as the structure of memory cell 210 in FIG. 5A and FIG. 5B.

In FIG. 2 through FIG. 9, the same elements are given the same reference numbers. Some portions (e.g., gate oxide and cell isolation structures) of memory device 200 are omitted from FIG. 5A through FIG. 9 so as to not obscure the elements of memory device 200 in the embodiments described herein.

As shown in FIG. 5A and FIG. 6, memory device 200 can include a substrate 599, dielectric materials 595 and 596 formed over (above) substrate 599, and data lines 271-W, 271-R, 272-W, 272-R, 273-W, and 273-R formed over (above) dielectric material 595 and 596 and substrate 599. As shown in FIG. 6, the memory cells (e.g., memory cells 210, 211, 213, 214, 216, and 217) of memory device 200 can be formed over (above) data lines data lines 271-W, 271-R, 272-W, 272-R, 273-W, and 273-R, and ground connection 297 formed over the memory cells. As shown in FIG. 5A through FIG. 9, the data lines (e.g., data lines data lines 271-W, 271-R, 272-W, 272-R, 273-W, and 273-R) of memory device 200 can be between the memory cells (e.g., memory cells 210 through 218) of memory device 200 and the substrate (e.g., substrate 599) of memory device 200.

Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) the X-direction and the Y-direction. The X-direction and Y-direction are perpendicular to each other.

As shown in FIG. 5A and FIG. 6, dielectric material 595 and 596 can be formed and under (below) data lines data lines 271-W, 271-R, 272-W, 272-R, 273-W, and 273-R to electrically isolate data lines data lines 271-W, 271-R, 272-W, 272-R, 273-W, and 273-R from substrate 599. Dielectric materials 595 and 596 can include different materials. For example, dielectric material 595 can include silicon dioxide and dielectric material 596 can be different from silicon dioxide. In some structures of memory device 200, one of dielectric material 595 and 596 can be omitted from memory device 200. Although FIG. 5 through FIG. 9 show dielectric materials 595 and 596 as separate portions from substrate 599, one or both of dielectric materials 595 and 596 can be part of the substrate (e.g., substrate 599) of memory device 200.

Data lines 271-W, 272-W, and 273-W (FIG. 6) can have the same conductive material (or alternatively different conductive material from) data lines 271-R, 272-R, and 273-R. An example conductive material for data lines 271-W, 271-R, 272-W, 272-R, 273-W, and 273-R include titanium nitride (TiN). Another example conductive material for data lines 271-W, 271-R, 272-W, 272-R, 273-W, and 273-R include metal or other conductive materials.

As shown in FIG. 5A and FIG. 6, ground connection 297 (schematically shown in FIG. 2) can include conductive material 597 located (e.g., formed) over the memory cells (e.g., memory cells 210, 211, 213, 214, 216, and 217) of memory device 200. Ground connection 297 (e.g., conductive material 597) can be coupled to a ground terminal (not shown) of memory device 200. Conductive material 597 can include doped polysilicon (conductively doped polysilicon), metal, other conductive materials, or a combination of different levels (e.g., layers) of conductive materials formed one over another in the Z-direction. As shown in FIG. 6 and FIG. 8, the memory cells of memory device 200 can share (e.g., can electrically couple to) conductive material 597 of ground connection 297. For example, the read channel regions (e.g., material 510 in FIG. 8 am FIG. 9) of the memory cells of memory device 200 can contact (e.g., can be electrically coupled to) conductive material 597.

As shown in FIG. 5B, access line 241 (which is schematically shown in FIG. 2) can be structured by (can include) a combination of a portion 541F and a portion 541B. Portions 541F and 541B can be called front and back conductive portions (e.g., conductive regions) that are opposite from each other in respect to (looking from) the Y-direction. Each of portions 541F and 541B can include a conductive material (or a combination of materials) that can be structured as a conductive line (e.g., conductive region). Thus, portions 541F and 541B can be part of conductive lines that are opposite from each other (e.g., opposite from each other in the Y-direction).

Each of portions 541F and 541B can include a structure (e.g., a piece (e.g., a layer)) of conductive material (e.g., metal, conductively doped polysilicon, or other conductive materials). Each of portions 541F and 541B can have a length (shown in FIG. 5B, FIG. 6, and FIG. 8) in the X-direction, a width (e.g., a height) in the Z-direction, and a thickness in the Y-direction.

Portion 541F can form a gate (transistor gate) of transistor T1 of memory cell 210 and a gate (transistor gate) of transistor T2 of memory cell 210. Portion 541B can also form a gate (transistor gate) of transistor T1 of memory cell 210 and a gate (transistor gate) of transistor T2 of memory cell 210.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

In an alternative structure of memory device 200, one of the two portions (e.g., portions 541F and 541B) of each of the access lines of memory device 200 can be omitted. For example, either portion 541F or portion 541B be omitted, such that access line 241 can include only either portion 541F or portion 541B. In the structure shown in FIG. 5A through FIG. 9, including two portions (e.g., portions 541F and 541B) in each access line and can help better control transistor T1 of each of the memory cells of memory device 200 during a read operation.

As shown in FIG. 5A, FIG. 7, and FIG. 8, charge storage structure 202 (which is schematically shown in FIG. 2) of each memory cell of memory device 200 can include portions (charge storage portions) 202A and 202B. Portions 202A and 202B can include the same material. Each of portions 202A and 202B can include a piece (e.g., a layer) of material that can trap or hold (e.g., store) charge. Example materials for portions 202A and 202B of charge storage structure 202 include semiconductor material (e.g., doped or undoped polysilicon), metal, titanium nitride (TiN), or other materials that can trap or hold charge. Thus, in some examples, each of portions 202A and 202B of charge storage structure 202 can include (e.g., can be formed from) a piece (e.g., a layer) of doped or undoped polysilicon), a piece (e.g., a layer) of metal, or a piece (e.g., a layer) of titanium nitride (TiN).

As shown in FIG. 5A and FIG. 8, memory cell 210 can include a dielectric structure (e.g., dielectric material) 525 to electrically separate data line 271-R and 271-W from each other. Dielectric structure 525 can include silicon dioxide. However, in an example, dielectric structure 525 can have a material (or materials) different from silicon dioxide to allow dielectric structure 525 to have an etch selectivity against adjacent silicon dioxide in some processes (e.g., processes described below with reference to FIG. 12 and FIG. 13). Example materials for dielectric structure 525 include silicon dioxide, hafnium oxide (e.g., $HfO_2$), aluminum oxide (e.g., $Al_2O_3$), or other dielectric materials. In an example structure of memory device 200, dielectric structure 525 includes a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 8, memory device 200 can include trenches 585. Each of trenches 585 can include sidewalls 585A and 585B opposite from each other in the X-direction, and a bottom 585C adjacent a portion of dielectric material 596. For simplicity, the following description describes only detailed structure of trench 585 at memory cell 210. However, trenches 585 at other respective memory cells 211 and 216 can have a similar structure as trench 585 at memory cell 210.

As shown in FIG. 8, in trench 585 at memory cell 210, data line (e.g., write data line) 271-W can have a U-shape that includes a portion (e.g., a side portion) 271A formed on sidewall 585A, a portion (e.g., a side portion) 271B formed on sidewall 585B, and a portion (e.g., a bottom portion) 271C formed on bottom 585C between portions 271A and 271B.

As shown in FIG. 8, at least a portion of data line 271R is between portions 271A and 271B of data line 271-W. Such data line 271-R can have sides (e.g., three sides including left and right sides in the X-direction and a bottom side) that are surrounded by respective portions 271A, 271B, and 271C of data line 271-W and separated from portions 271A, 271B, and 271C by dielectric structure 525. Thus, as shown in FIG. 8, at least a portion of data line 271-R can have a side (e.g., left side) adjacent portion 271A of data line 271-W and separated from portion 271A by dielectric structure 525, a side (e.g., right side) adjacent portion 271B of data line 271-W and separated from portion 271A by dielectric structure 525, and a side (e.g., bottom side) adjacent portion 271C of data line 271-W and separated from portion 271A by dielectric structure 525. Other data lines of memory device 200 (e.g., data lines 272-R, 272-W, 273-R, and 273-W in FIG. 8) can have structures like the structures of data lines 271-R and 271-W in FIG. 8.

As shown in FIG. 5A through FIG. 8, memory cell 210 can include materials 520A and 520B located between data line (e.g., write data line) 271-W and portions 202A and 202B, respectively. Materials 520A and 520B can include the same material. Materials 520A and 520B can be electrically coupled to (e.g., directly coupled to (contact)) data line 271-W. Materials 520A and 520B can also be electrically coupled to (e.g., directly coupled to (contact)) portions 202A and 202B, respectively. As described above with reference to FIG. 2, charge storage structure 202 (which includes portions 202A and 202B in FIG. 5A) of memory cell 210 can form the memory element of memory cell 210. Thus, memory cell 210 can include a memory element (which includes a combination of portions 202A and 202B) located above (over) materials 520A and 520B with respect to the Z-direction and the memory element contacts (e.g., directly coupled to) materials 520A and 520B.

Each of materials 520A and 520B can form a source (e.g., source terminal), a drain (e.g., drain terminal), and a channel region (e.g., write channel region) between the source and the drain of transistor T2 of memory cell 210. Thus, as shown in FIG. 5A and FIG. 8, the source, channel region, and the drain of transistor T2 of memory cell 210 can be formed from a single piece of the same material, as shown by material 520A (on side of memory cell 210) and material 520B (on another side of memory cell 210). Therefore, transistor T2 of memory cell 210 can include a source, a drain, and a channel region that can be formed from the same material of the same conductivity type (e.g., either n-type or p-type). Other memory cells of memory device 200 can also include a structure and materials 520A and 520B like memory cell 210.

As described above, material 520A and 520B can form a channel region of transistor T2. Thus, as shown in FIG. 5A and FIG. 8, the channel region of transistor T2 can include a portion (e.g., material 520A) formed over and electrically coupled to portion 271A of data line 271-W, and a portion (e.g., material 520B) formed over and electrically coupled to portion 271B of data line 271-W. As shown in FIG. 5A and FIG. 8, data line 271-W can be located (e.g., can be formed) under (below) both materials 520A and 520B and portions 202A and 202B.

Each of materials 520A and 520B can include a structure (e.g., a piece (e.g., a layer)) of semiconductor material. In the example where transistor T2 is an NFET (as described above), materials 520A and 520B can include n-type semiconductor material (e.g., n-type silicon).

In another example, the semiconductor material that forms each of materials 520A and 520B can include a structure (e.g., a piece) of oxide material. Examples of the oxide material used for materials 520A and 520B include semiconducting oxide materials, transparent conductive oxide materials, and other oxide materials.

As an example, each of materials 520A and 520B can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation to read information from a selected memory cell (e.g., memory cell 210), charge from charge storage structure 202 (from portions 202A and 202B) of the selected memory cell may leak to transistor T2 of the selected memory cell. Using the material listed above for the channel region (e.g., material 520A or 520B) of transistor T2 can reduce or prevent such a leakage. This improves the accuracy of information read from the selected memory cell and improves the retention of information stored in the memory cells of the memory device (e.g., memory device 200) described herein.

The materials listed above are examples of material 520. However, other materials (e.g., a relatively high band-gap material) different from the above-listed materials can be used.

As shown in FIG. 5A and FIG. 8, materials 520A and 520B can be electrically coupled (e.g., directly coupled) to portions 202A and 202B, respectively, of memory cell 210 without an intermediate material (e.g., without a conductive material) between materials 520A and 520B and portions 202A and 202B, respectively. In an alternative structure (not shown), materials 520A and 520B can be electrically coupled (e.g., indirectly coupled) to portions 202A and 202B, respectively, of memory cell 210 through an intermediate material (e.g., a conductive material) between materials 520A and 520B and portions 202A and 202B, respectively.

Figure 14:
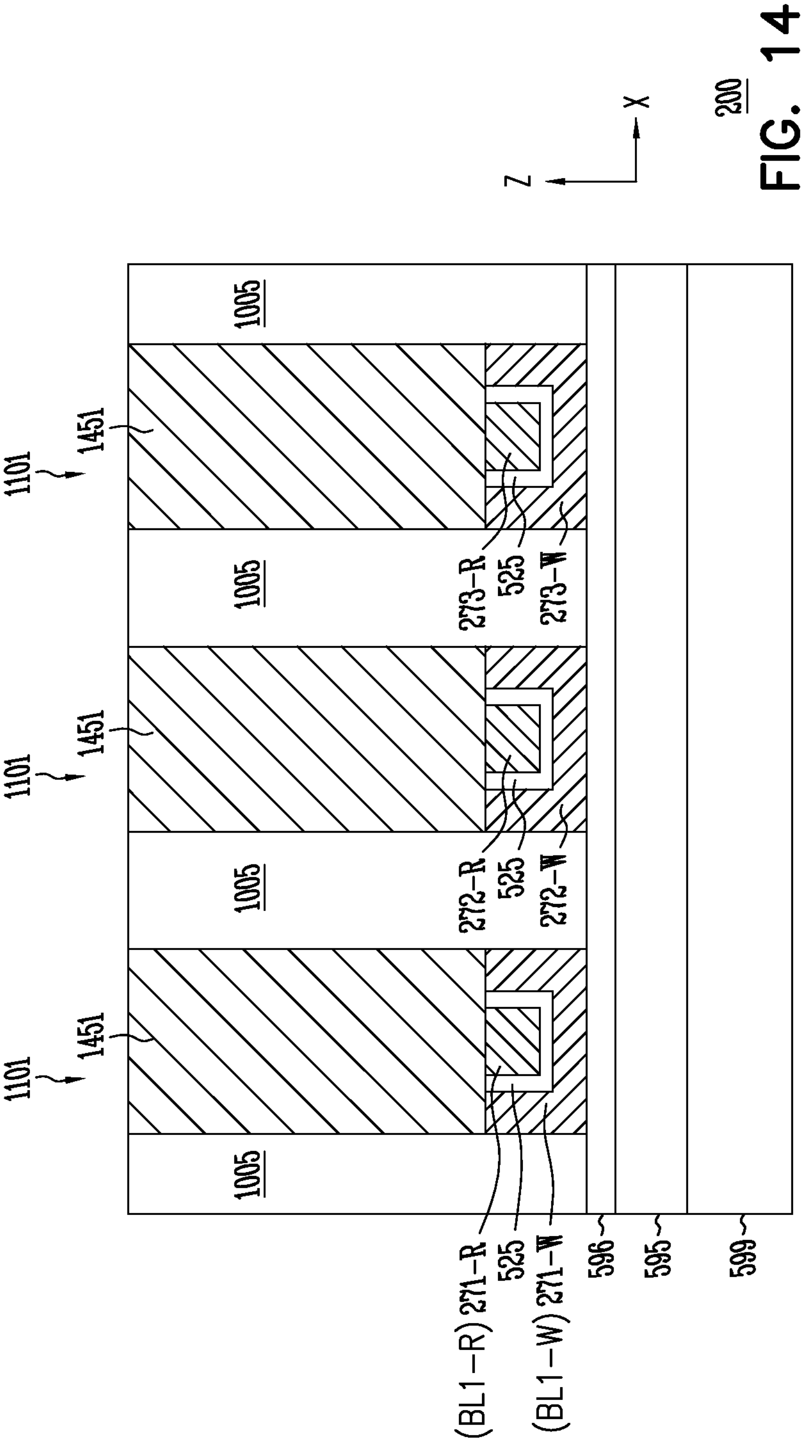

As shown in FIG. 5A through FIG. 9, memory cell 210 can include a material 510, which can include a structure (e.g., a piece (e.g., a layer)) of semiconductor material. Example materials for material 510 can include silicon, polysilicon (e.g., undoped or doped polysilicon), germanium, silicon-germanium, or other semiconductor materials and semiconducting oxide materials (oxide semiconductors, e.g., SnO or other oxide semiconductors). In an example structure of memory device 200, material 510 can include a semiconductor material with a dopant grading and activated. Thus, material 510 can include different doping concentration (e.g., graded doping concentration) at different portions of material 510. In an example structure, material 510 can be formed by processes similar to or the same as the processes of forming semiconductor material 1451 (FIG. 14) of memory device 200 (described in detail below). Thus, material 510 can be the same as material 1451 (FIG. 14).

As described above with reference to FIG. 2, transistor T1 of memory cell 210 includes a channel region (e.g., read channel region). In FIG. 5A through FIG. 9, the channel region of transistor T1 of memory cell 210 can include (e.g., can be formed from) material 510. Material 510 can be electrically coupled to (e.g., directly coupled to (contact) data line (e.g., read data line) 271-R. As described above with reference to FIG. 2, memory cell 210 can include a read path. In FIG. 5A through FIG. 9, material 510 (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, material 510 can conduct a current (e.g., read current (e.g., holes)) between data line 271-R and ground connection 297 (through part of conductive material 597). The direction of the read current can be from data line 271-W to ground connection 297. In the example where transistor T1 is a PFET and transistor T2 is an NFET, the material that forms material 510 can have a different conductivity type from material 520. For example, material 510 can include p-type semiconductor material (e.g., p-type silicon) regions, and materials 520A and 520B can include n-type semiconductor material (e.g., n-type gallium phosphide (GaP)) regions.

As shown in FIG. 5A, FIG. 7, and FIG. 8, memory cell 210 can include dielectric structure 515 (formed by dielectric portions 515A and 515B) between and adjacent the channel region (which includes materials 520A and 520B) of transistor T2 and the charge storage structure (which includes portions 202A and 202B) of memory cell 210. Dielectric portions 515A and 515B can be oxide regions (e.g., channel oxide regions) and can include the same material (e.g., silicon dioxide). Dielectric portions 515A and 515B can have a dielectric material (or materials) different from the material (or materials) dielectric structure 525.

As shown in FIG. 8, memory device 200 can include dielectric material (e.g., silicon dioxide) 555 that can form a structure (e.g., a dielectric structure) between respective adjacent memory cells.

As shown in FIG. 5B, FIG. 6, and FIG. 8, portion 541F can be adjacent part of material 510 and part of materials 520A and 520B and can span across (e.g., overlap in the X-direction) part of material 510 and part of materials 520A and 520B of memory cell 210 and other memory cells (e.g., memory cells 211 and 216 in FIG. 8). As described above, material 510 can form part of a read channel region of transistor T1 and materials 520A and 520B can form part of a write channel region of transistor T2. Thus, as shown in FIG. 5B, FIG. 6, and FIG. 8, part of portion 541F can span across (e.g., overlap) part of (e.g., on a side (e.g., front side) in the Y-direction) both read and write channel regions of transistors T1 and T2, respectively. Similarly, part of portion 541B can be adjacent part of material 510 and a part of material 520, and can span across (e.g., overlap in the X-direction) part of (e.g., on another side (e.g., back side opposite from the front side) in the Y-direction) material 510 and a part of material 520.

As shown in FIG. 8, each of portions 541F and 541B of access line 241 can also span across (e.g., overlap in the X-direction) part of material 510 (e.g., a portion of the read channel region of transistor T1) and part of material 520 (e.g., a portion of write channel region of transistor T2) of other memory cells (e.g., memory cells 211 and 216) of memory device 200. The spanning (e.g., overlapping) of access line 241 across material 510 and material 520 allows access line 241 (a single access line) to control (e.g., to turn on or turn off) both transistors T1 and T2 of memory cells 210, 211, and 16.

As shown in FIG. 9, memory device 200 can include dielectric materials 545 (e.g., gate oxide regions) to electrically separate portions 541F and 541B of access line 241 from other elements of respective memory cells 210, 211, and 212. The material (or materials) for dielectric materials 545 can be the same as (or alternatively, different from) the material (or materials) of dielectric portions 515A and 515B. Example materials for dielectric materials 545 can include silicon dioxide, hafnium oxide (e.g., $HfO_2$), aluminum oxide (e.g., $Al_2O_3$), or other dielectric materials.

The structure of the data lines (and the memory cells) as shown in FIG. 5A through FIG. 9 have a relatively compact structure. This can improve device scaling and reduce the size of memory device 200.

Figure 10:
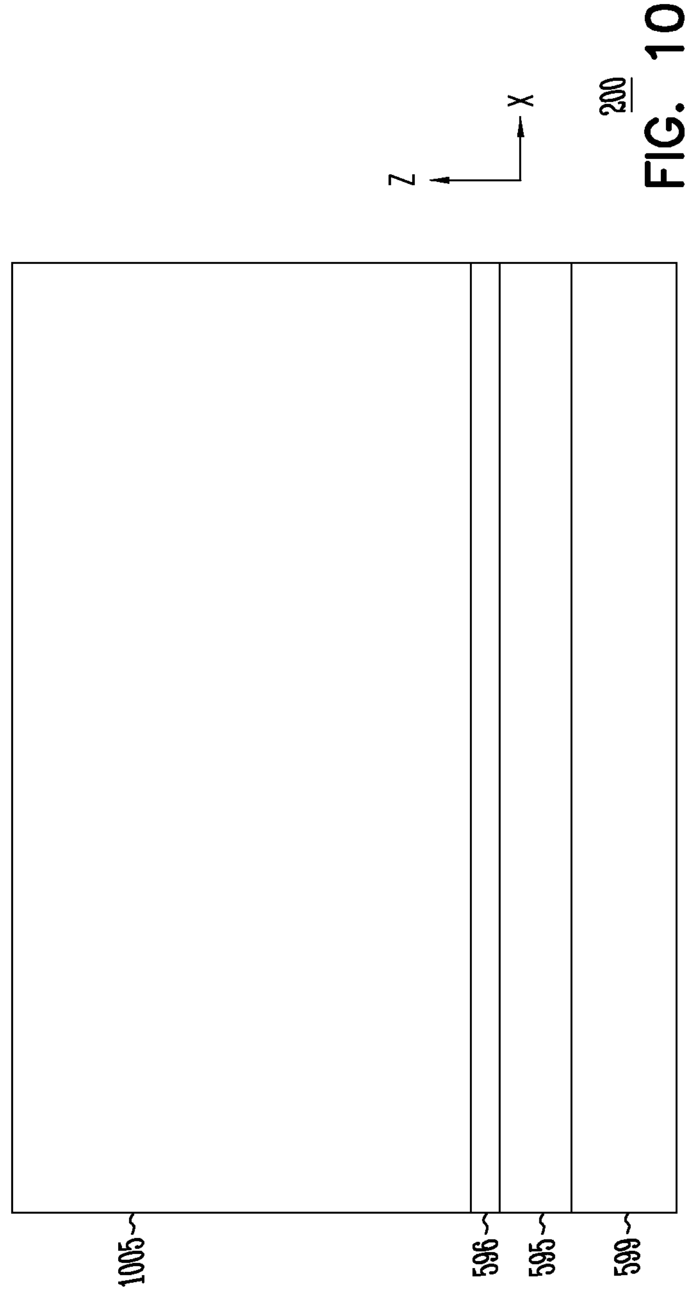
FIG. 10 through FIG. 28 show processes of forming a memory device, according to some embodiments described herein.

FIG. 10 through FIG. 28 show different views of elements during processes of forming a memory device 200, according to some embodiments described herein. FIG. 10 shows memory device 200 after dielectric materials 595 and 596, and a dielectric 1005 are formed over substrate 599. The processes used in FIG. 10 can include forming (e.g., depositing) dielectric material 595 over substrate 599, forming (e.g., depositing) dielectric material 596 over dielectric material 595, and forming (e.g., depositing) dielectric material 1005 over dielectric material 595. An example of dielectric material 1005 includes silicon dioxide. In some processes of forming memory device 200, one of dielectric material 595 and 596 can be omitted (e.g., not formed).

Figure 11:
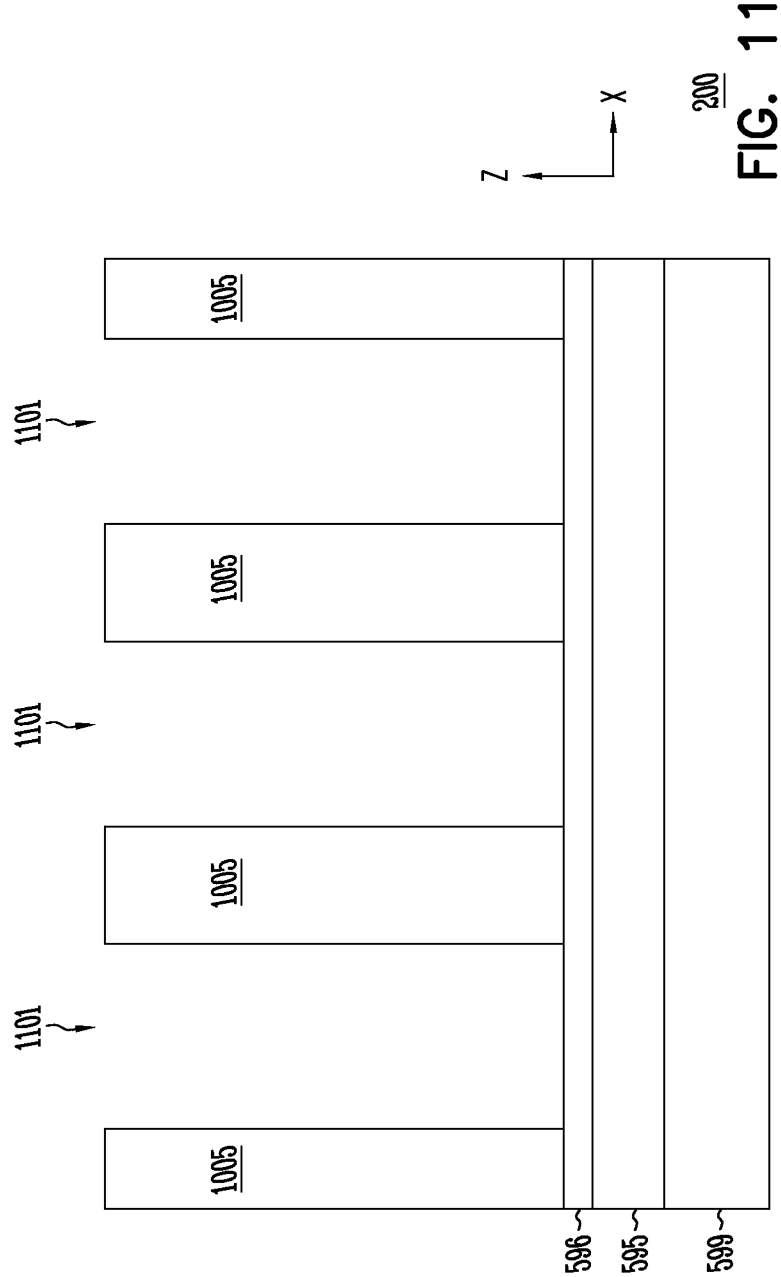

FIG. 11 shows memory device 200 after trenches (e.g., openings) 1101 are formed. Forming trenches 1101 can include removing (e.g., by patterning) part of dielectric material 1005 at the locations of trenches 1101. Remaining portions (a remaining part) of dielectric material 1005 are shown in FIG. 11.

Figure 12:
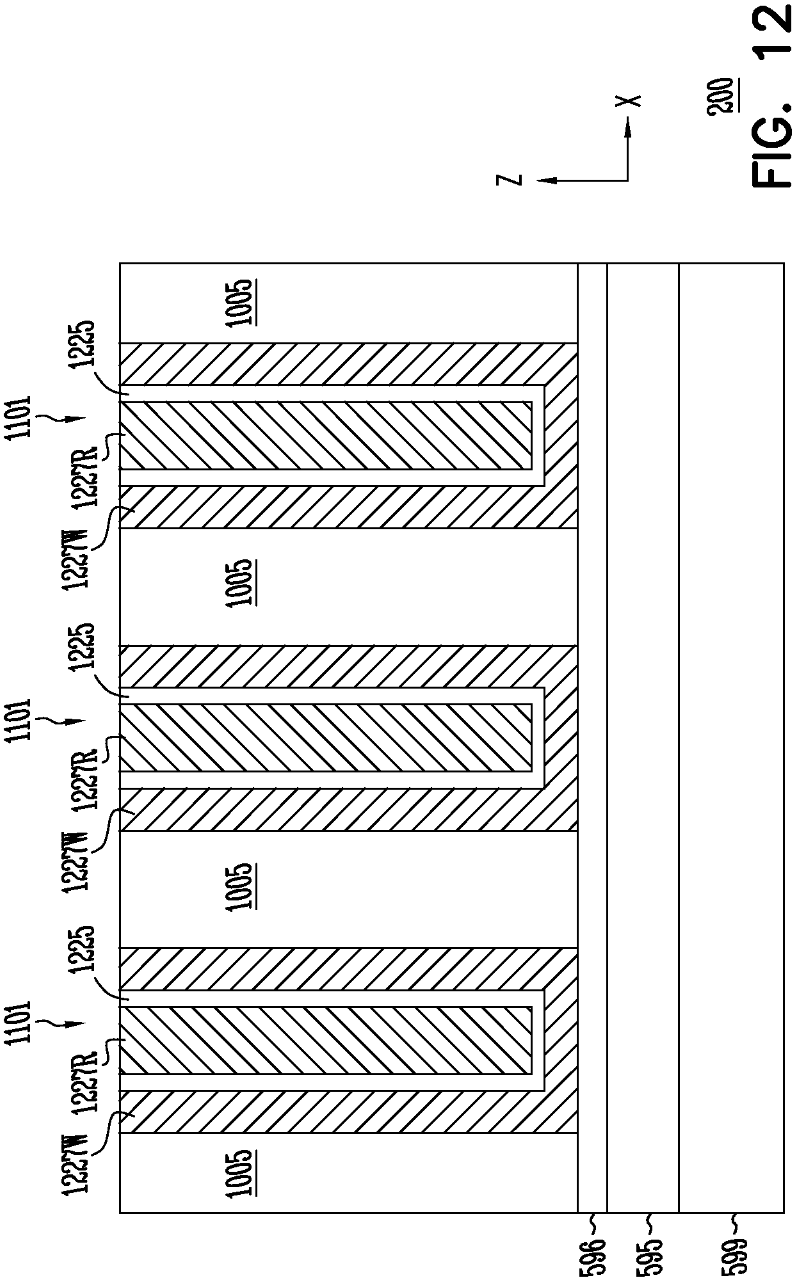

FIG. 12 shows memory device 200 after conductive material 1227W, dielectric material 1225, and conductive material 1227R are formed (e.g., filled) in trenches 1101. Conductive material 1227W, dielectric material 1225, and conductive material 1227R can be sequentially formed one after another in the order of conductive material 1227W, dielectric material 1225, and conductive material 1227R. For example, the processes used in FIG. 11 can include forming conductive material 1227W on opposite sidewalls (not labeled) of each of trenches 1101 and on the bottom (not labeled) of each of trenches 1101, forming dielectric material 1225 adjacent (e.g., formed on) conductive material 1227W, and forming conductive material 1227R adjacent (e.g., formed on) dielectric material 1225. As shown in FIG. 11, at least a portion of conductive material 1227R is formed between portions (e.g., left and right portions) of conductive material 1227W and separated from conductive material 1227W by dielectric material 1225.

Conductive material 1227W is subsequently processed to formed data line (e.g., write data lines) 271-W, 272-W, and 273-W (FIG. 8). Conductive material 1227R is subsequently processed to formed data line (e.g., read data lines) 271-R, 272-R, and 273-R (FIG. 8). Dielectric material 1225 is subsequently processed to formed dielectric structure 525 (FIG. 8) of a respective memory cell (e.g., memory cell 210 FIG. 8). Thus, conductive materials 1227W can be the same the material (e.g., titanium, metal, or other conductive materials) as data lines 271-W, 272-W, and 273-W. Conductive materials 1227R can be the same the material (e.g., titanium, metal, or other conductive materials) as data lines 271-R, 272-R, and 273-R.

Dielectric material 1225 can have the same material as dielectric structure 525. For example, dielectric material 1225 can include silicon dioxide. However, in an example, dielectric structure 525 can have a material (or materials) different from dielectric material (e.g., silicon dioxide) 1005 to allow dielectric material 1225 to have an etch selectivity (e.g., wet etch selectivity) against adjacent dielectric material 1005. This etch selectivity of dielectric material 1225 allows a portion of dielectric material 1225 to remain in trenches 1101 in subsequent processes (FIG. 13) when a portion (e.g., top portion) of dielectric material 1225 is removed (e.g., etched). Example materials for dielectric material 1225 include hafnium oxide, aluminum oxide, or other dielectric materials (e.g., other high-k dielectric materials).

Figure 13:
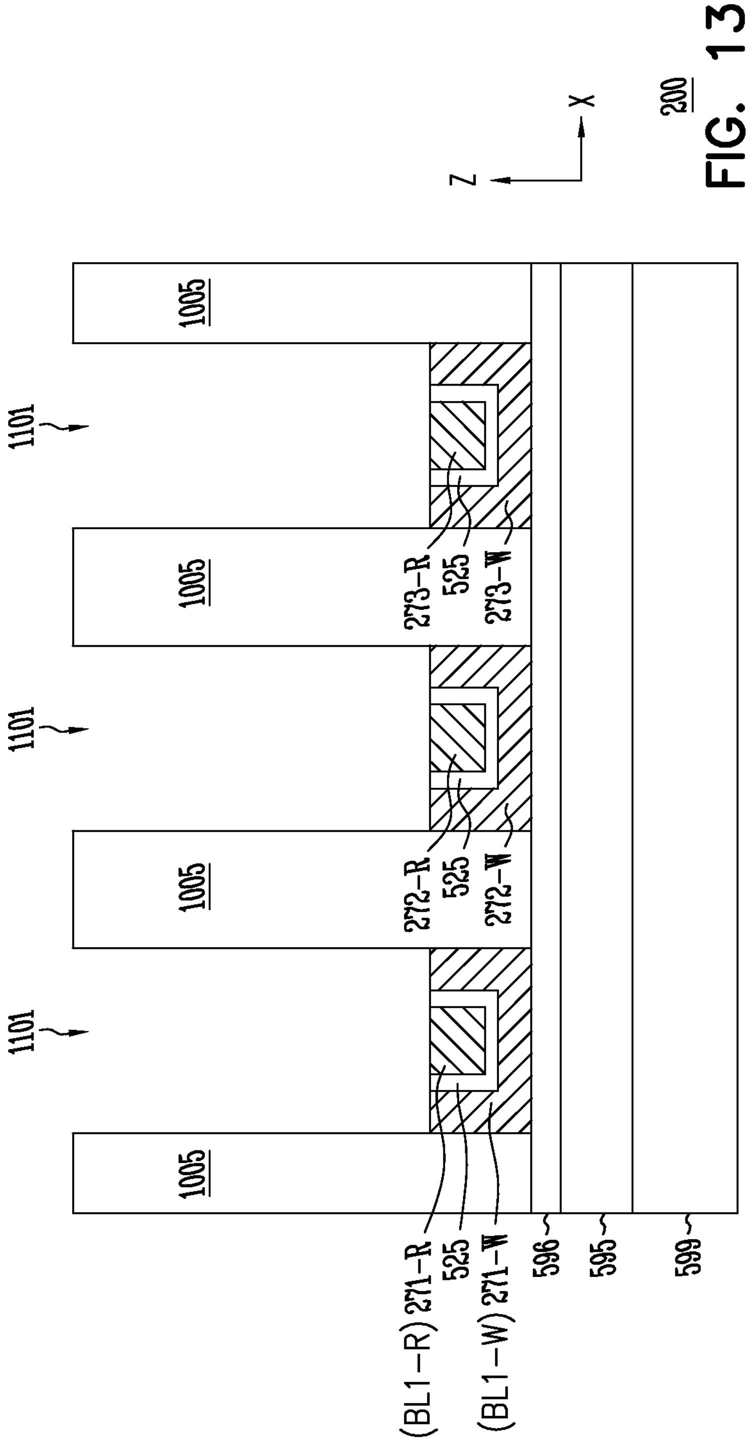

FIG. 13 shows memory device 200 after a portion (e.g., top portion) of each of conductive material 1227W, dielectric material 1225, and conductive material 1227R are removed (e.g., recessed) from each of trenches 1101. Remaining portions (a remaining part) of conductive material 1227W, dielectric material 1225, and conductive material 1227R in trenches 1101 are shown in FIG. 13. The remaining portion of conductive material 1227W in trenches 1101 can form data lines 271-W, 272-W, and 273-W. The remaining portion of conductive material 1227R in trenches 1101 can form data lines 271-R, 272-R, and 273-R. The remaining portion of dielectric material 1225 can form dielectric structures 525 between respective data lines 271-W, 272-W, and 273-W and data lines 271-R, 272-R, and 273-R.

FIG. 14 shows memory device 200 after a semiconductor material 1451 is formed over conductive material 1227W, dielectric material 1225, and conductive material 1227R in trenches 1101. Semiconductor material 1451 of FIG. 14 can be conductively doped semiconductor material and can be deposited (e.g., blanket deposited) over conductive material 1227W, dielectric material 1225, and conductive material 1227R in trenches 1101.

Semiconductor material 1451 can be doped with different concentration of dopants (impurities) in different portions (e.g., different layers in the Z-direction) of semiconductor material 1451. The dopants (impurities) can be p-type dopants, such that semiconductor material 1451 can be p-type semiconductor material. The concentration of dopants in semiconductor material 1451 can be graded in the Z-direction and activated, such that semiconductor material 1451 can include portions (e.g., multiple layers in the Z-direction) having different concentrations of dopants (which have been activated). As an example, semiconductor material 1451 can includes p+/undoped/p+ portions (e.g., three layers in the Z-direction, not labeled in FIG. 14). The undoped semiconductor portion can be between the p+ portions. Thus, the processes of forming semiconductor material 1451 can include a doping process, which can include a dopant grading process and dopant activation process. The dopant grading process can include introducing dopants having different concentrations in different portions (e.g., p+/undoped/p+ portions, as described above) of semiconductor material 1451. The dopant activation process can include an anneal process (e.g., a laser anneal process) for crystallization and activation of the dopants. A CMP (chemical mechanical polishing or planarization) process may be performed during formation of semiconductor material 1451.

As an example, forming semiconductor material 1451 can include forming (e.g., depositing) a p+ portion, forming (e.g., depositing) an undoped portion over the p+ portion, and forming (e.g., depositing) another p+ portion over the undoped portion. The example described herein includes three levels (e.g., layers) of graded portions of semiconductor material 1451. However, semiconductor material 1451 can include a different number (e.g., different from three) of graded portions. Thus, semiconductor material 1451 as described herein can be formed (e.g., deposited) with a dopant grading and activated.

In subsequent processes of forming memory device 200, semiconductor material 1451 can be structured to form a channel region (e.g., read channel region) of a transistor (e.g., transistor T1) of a respective memory cell (e.g., memory cell 210 in FIG. 5A and FIG. 8) of memory device 200. Thus, the memory cells of memory device 200 can include material (e.g., read channel region) 510 that can be formed (e.g., deposited) with a dopant grading and activated.

In the example above, semiconductor material 1451 can be p-type semiconductor material, such that the channel region (formed from semiconductor material 1451) can be a p-channel region of a PFET structure (e.g., the structure of transistor T1) to conduct currents (e.g., holes) during an operation (e.g., read operation) of memory device 200. The processes of forming semiconductor material 1451 described herein can lead to a more reliable structure (e.g., read channel region of transistor T1) formed from semiconductor material 1451.

Figure 15:
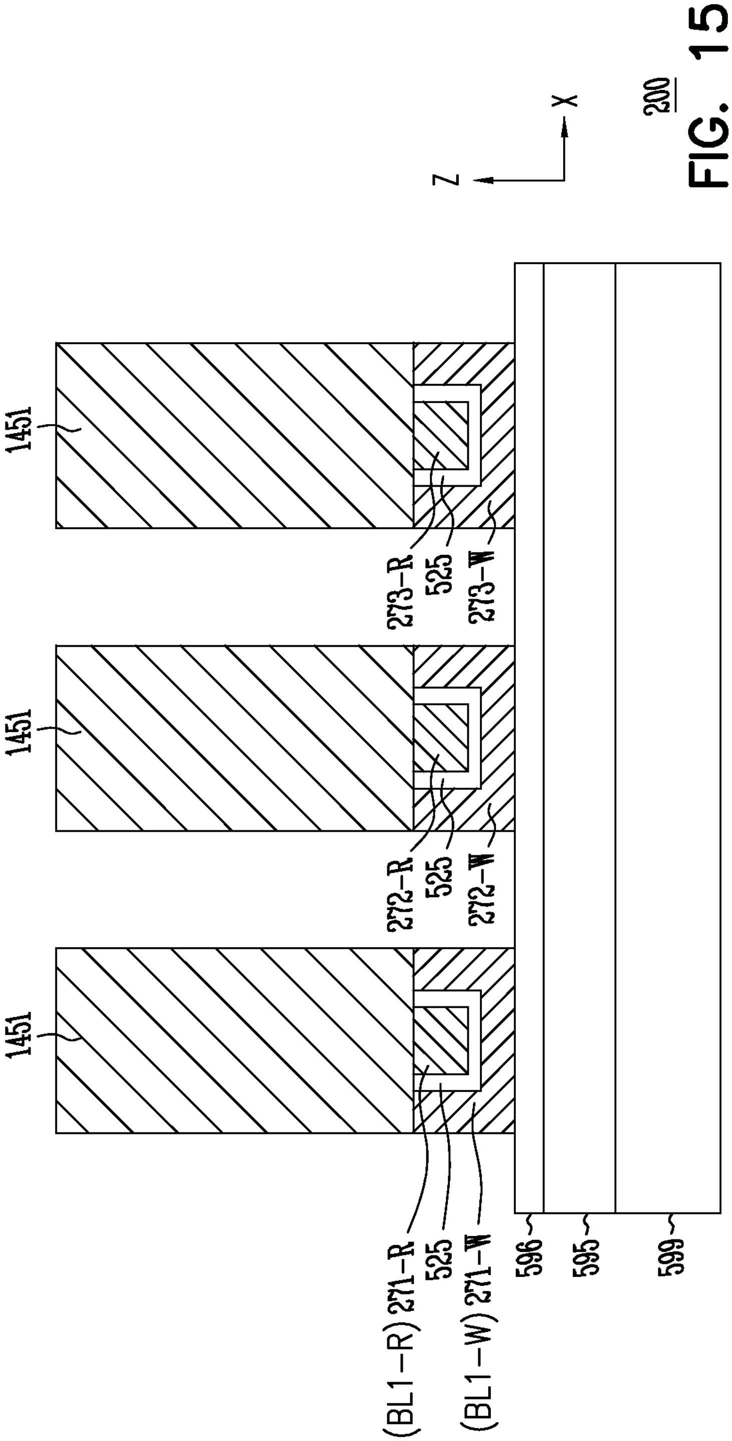

FIG. 15 shows memory device 200 after dielectric material 1005 is removed (e.g., exhumed). As shown in FIG. 15, portions of semiconductor material 1451 (which were formed in respective trenches 1101 in FIG. 14) are not removed when dielectric material 1005 is removed.

Figure 16:
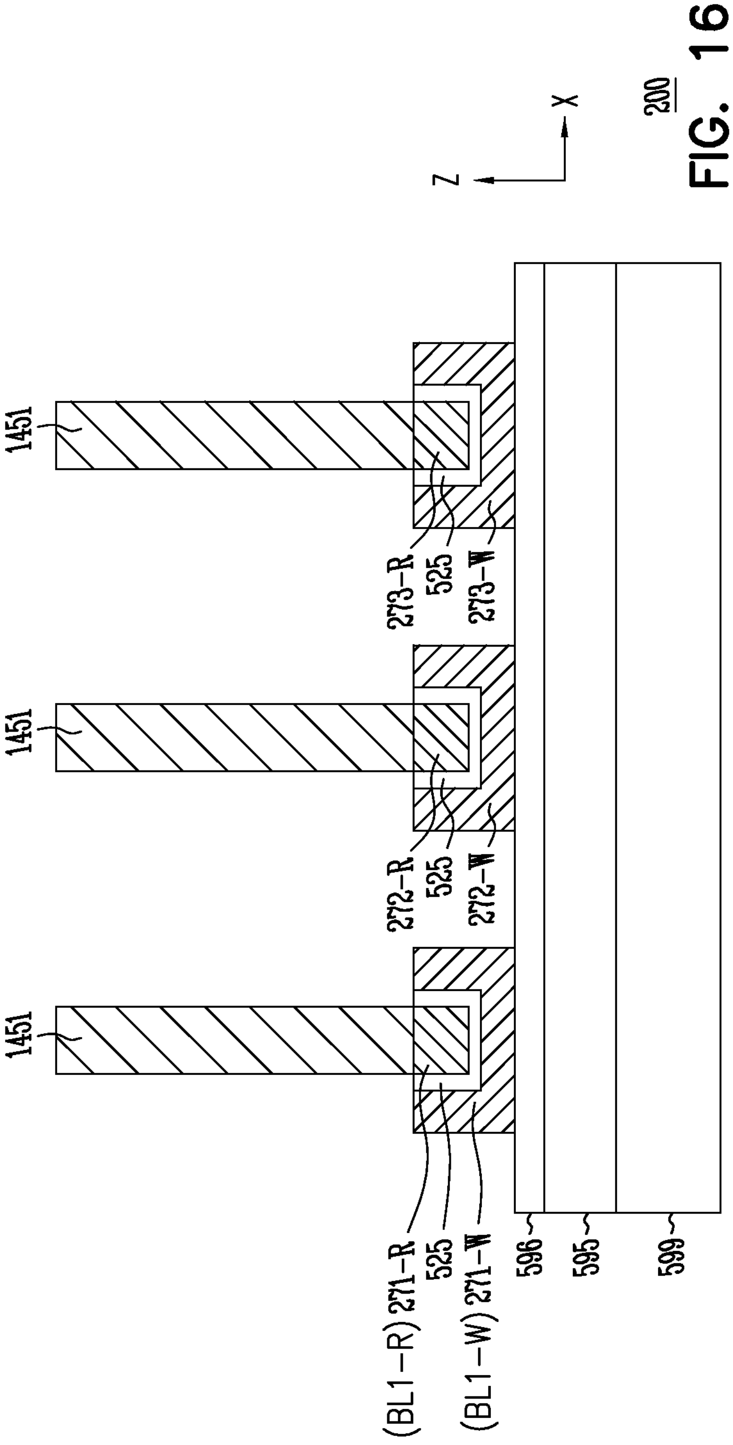

FIG. 16 shows memory device 200 after part of (e.g., left and right side) respective portions of semiconductor material 1451 is removed. The remaining portions (remaining part) of semiconductor material 1451 are shown in FIG. 16

Figure 17:
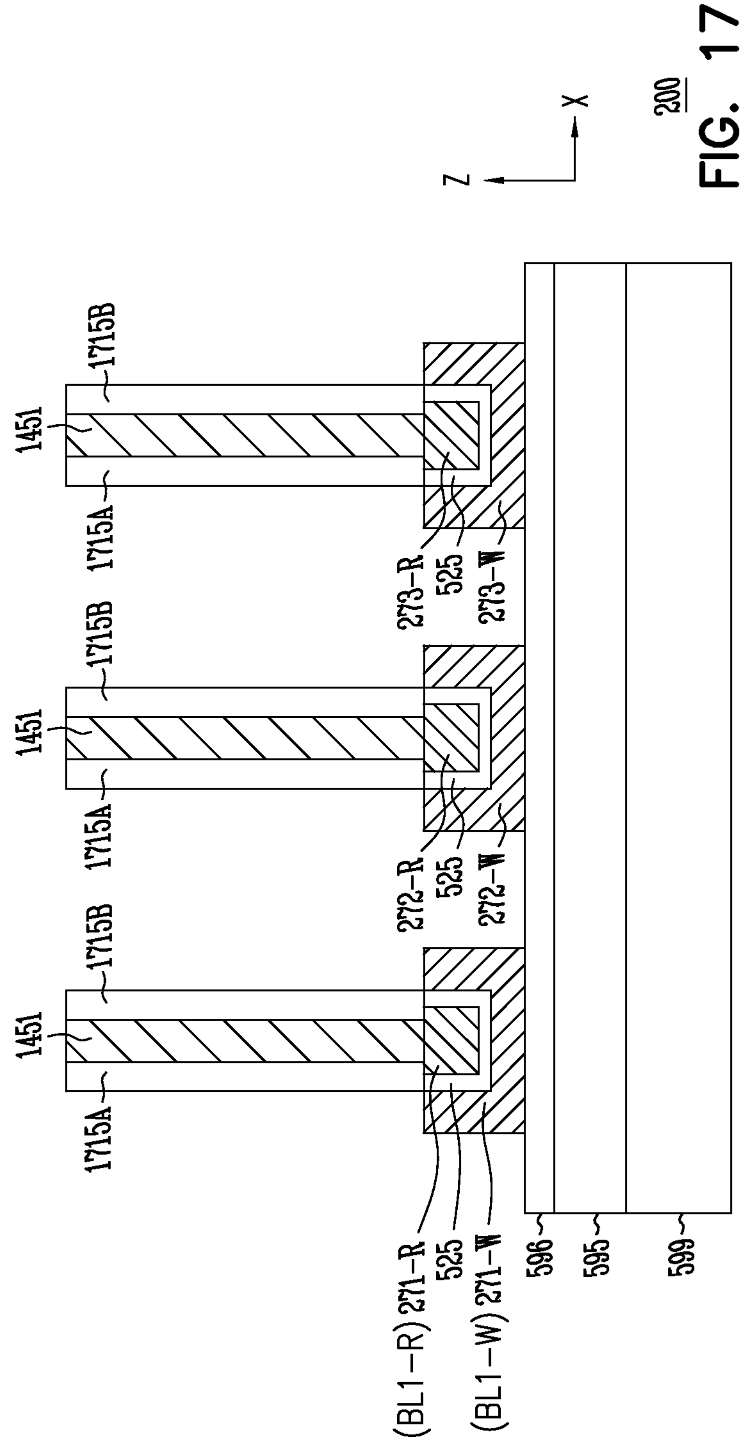

FIG. 17 shows memory device 200 after dielectric materials 1715A and 1715B are formed on respective portions (e.g., three portions) of semiconductor material 1451. Dielectric materials 1715A and 1715B can include silicon dioxide.

The processes associated with removing part of semiconductor material 1451 in FIG. 16 and forming dielectric materials 1715A and 1715B in FIG. 17 can including oxidizing semiconductor material 1451 of FIG. 15 and thinning it with vapor hydrogen fluoride (HF). In FIG. 17, the thickness (in the X-direction) of each portion of semiconductor material 1451 and respective dielectric materials 1715A and 1715B (on both sides of each portion of semiconductor material 1451) can be controlled such that each portion of semiconductor material 1451 can remain over a respective portion of a read data line (e.g., data line 271-R, 272-R, or 273-R) and electrically separated from a respective portion of a write data line (e.g., data line 271-W, 272-W, or 273-W). This thickness control is performed to prevent a read channel region (formed by a portion of semiconductor material 1451 in FIG. 17) from being shorted to a write data line (e.g., data line 271-W, 272-W, or 273-W in FIG. 17).

Figure 18:
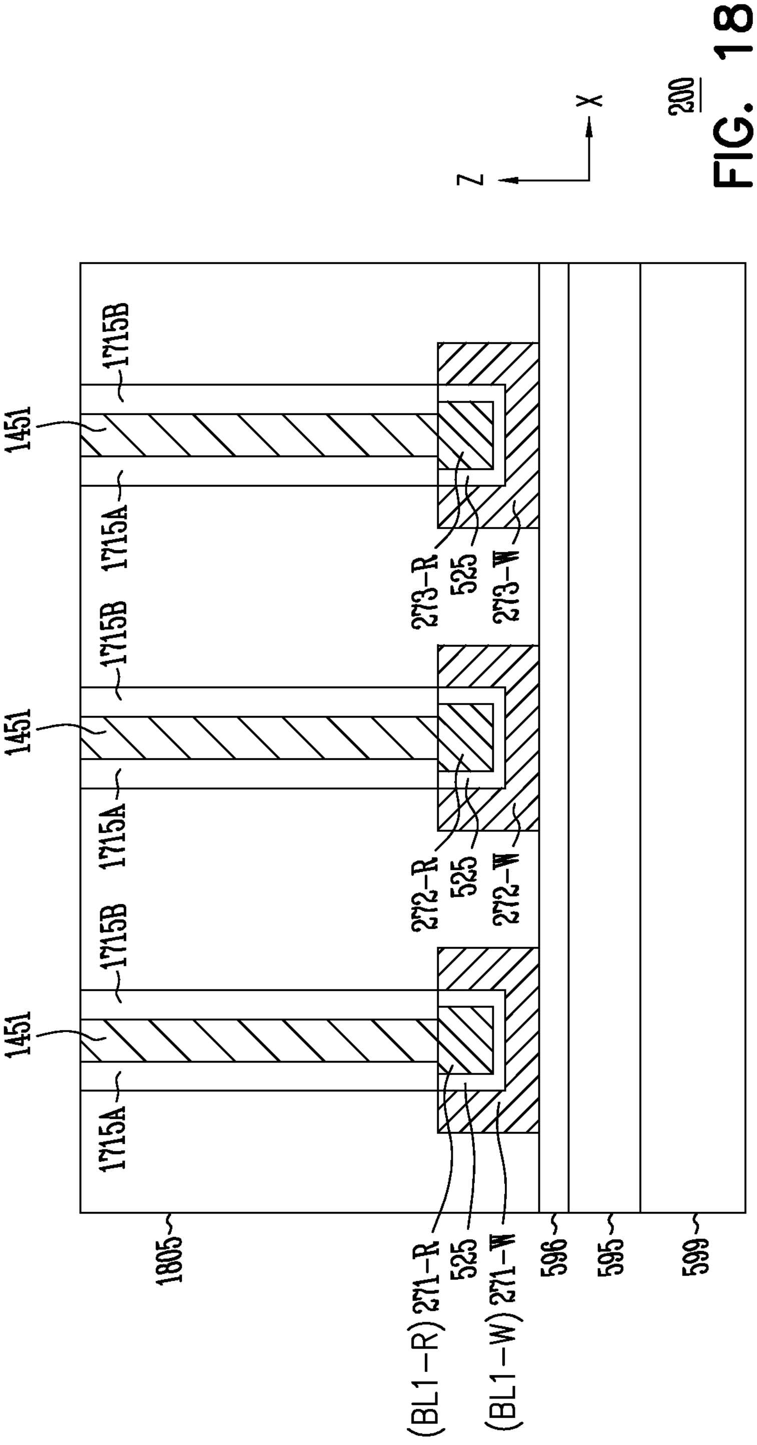

FIG. 18 shows memory device 200 after a dielectric material (e.g., silicon dioxide) 1805 is formed over other materials of memory device 200. A CMP process can also be performed to remove a portion (e.g., top portion) of dielectric material 1805.

Figure 19:
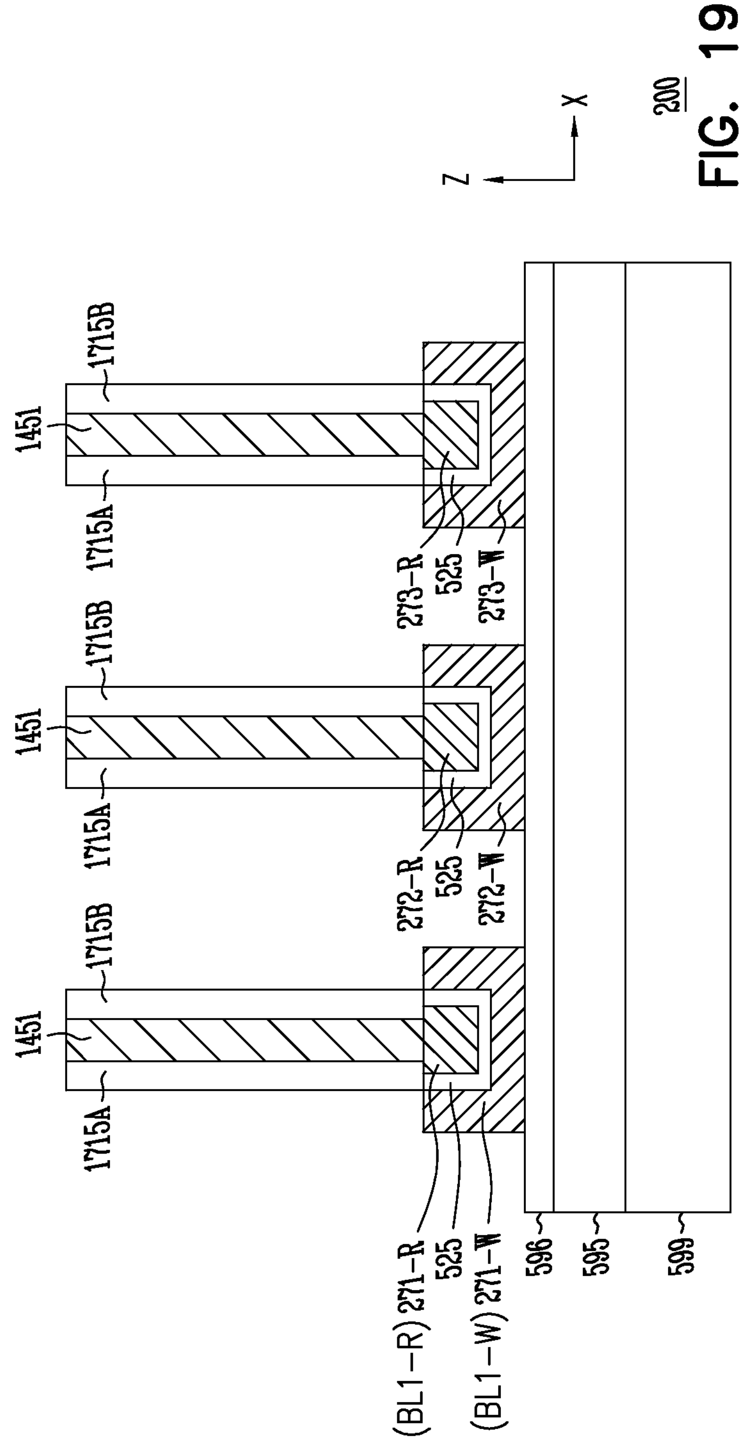

FIG. 19 shows memory device 200 after dielectric material 1805 is removed (e.g., exhumed).

Figure 20:
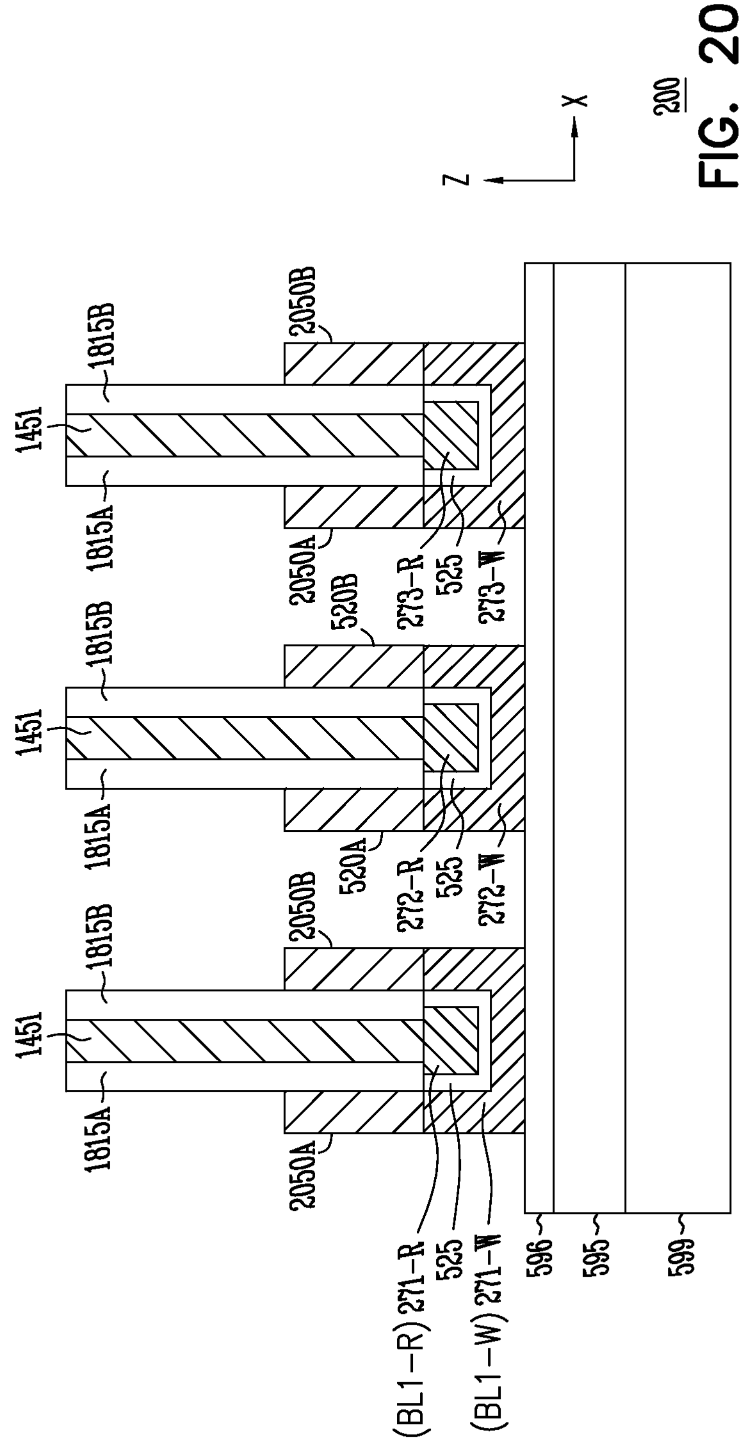

FIG. 20 shows memory device 200 after materials 2050A and 2050B are formed over (e.g., formed on) respective portions (e.g., left and right portions) of each of data lines 271-W, 272-W, and 273-W. Materials 2050A and 2050B are subsequently processed to formed channel regions (e.g., write channel regions) that include materials 520A and 520B (FIG. 8). Thus, materials 2050A and 2050B in FIG. 20 can be the same as materials 520A and 520B. Forming materials 2050A and 2050B can include forming (e.g., depositing) an initial material (e.g., channel material) over other materials of memory device in FIG. 19, removing (e.g., using a recess process) a portion (e.g., upper portion) of the initial material, and removing (e.g., using a punch through process) part of the remaining portion (e.g., lower portion) of the initial material to separate (in the X-direction) the remaining portion of the initial material into portions of materials 2050A and 2050B shown in FIG. 20.

Figure 21:
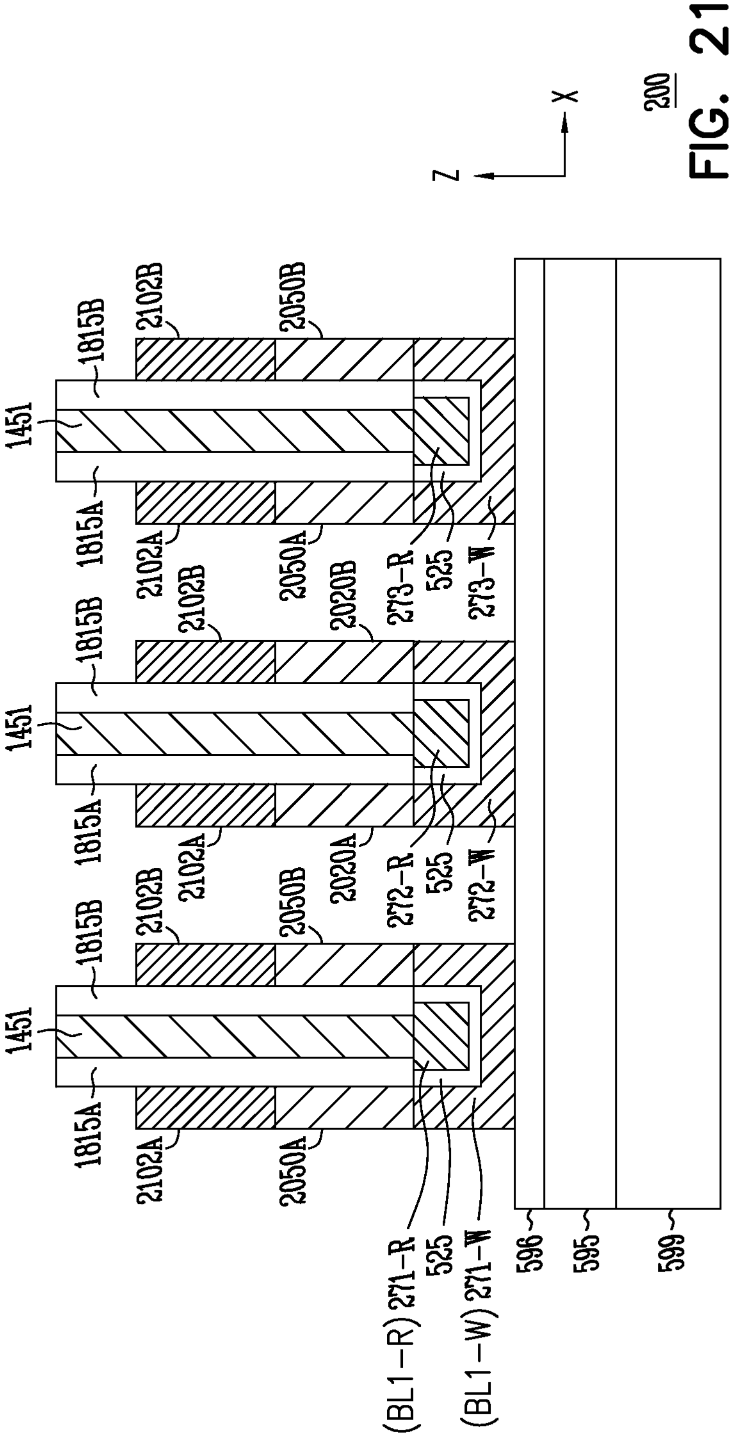

FIG. 21 shows memory device 200 after materials 2102A and 2102B are formed over (e.g., formed on) respective materials 2050A and 2050B. Materials 2102A and 2102B are subsequently processed to formed portions (charge storage portions) 202A and 202B (FIG. 8) of charge storage structure 202 of a respective memory cell of memory device 200. Thus, materials 2102A and 2102B in FIG. 21 can be the same as the material (e.g., charge storage material) of portions 202A and 202B. Forming materials 2102A and 2102B can include forming (e.g., depositing) a charge storage material over materials 2050A and 2050B and other materials of memory device in FIG. 19, removing (e.g., using a recess process) a portion (e.g., upper portion) of the charge storage material, and removing (e.g., using a punch through process) part of the remaining portion (e.g., lower portion) of the charge storage material to separate (in the X-direction) the remaining portion of charge storage material into portions of materials 2102A and 2102B shown in FIG. 21.

Figure 22:
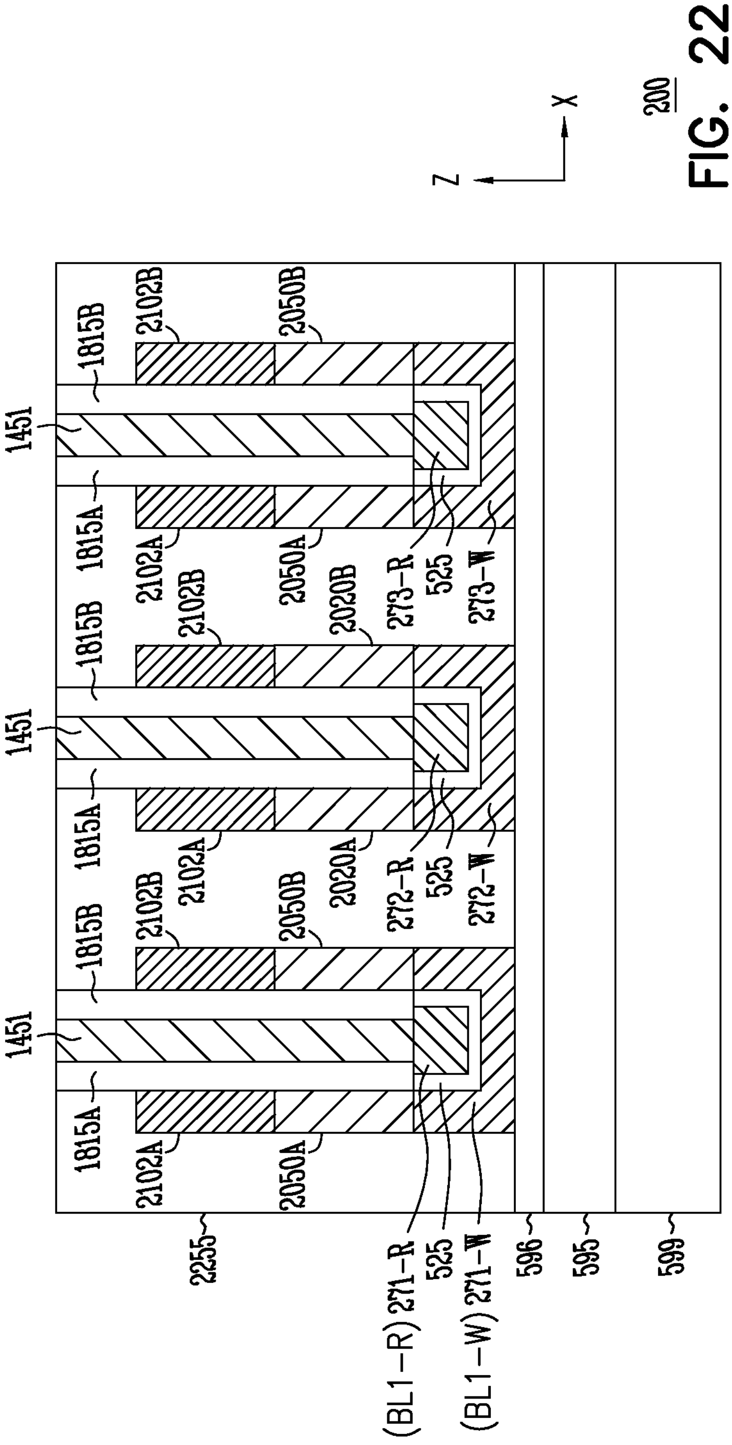

FIG. 22 shows memory device 200 after a dielectric material (e.g., silicon dioxide) 2255 is formed over other materials of memory device 200.

Figure 23:
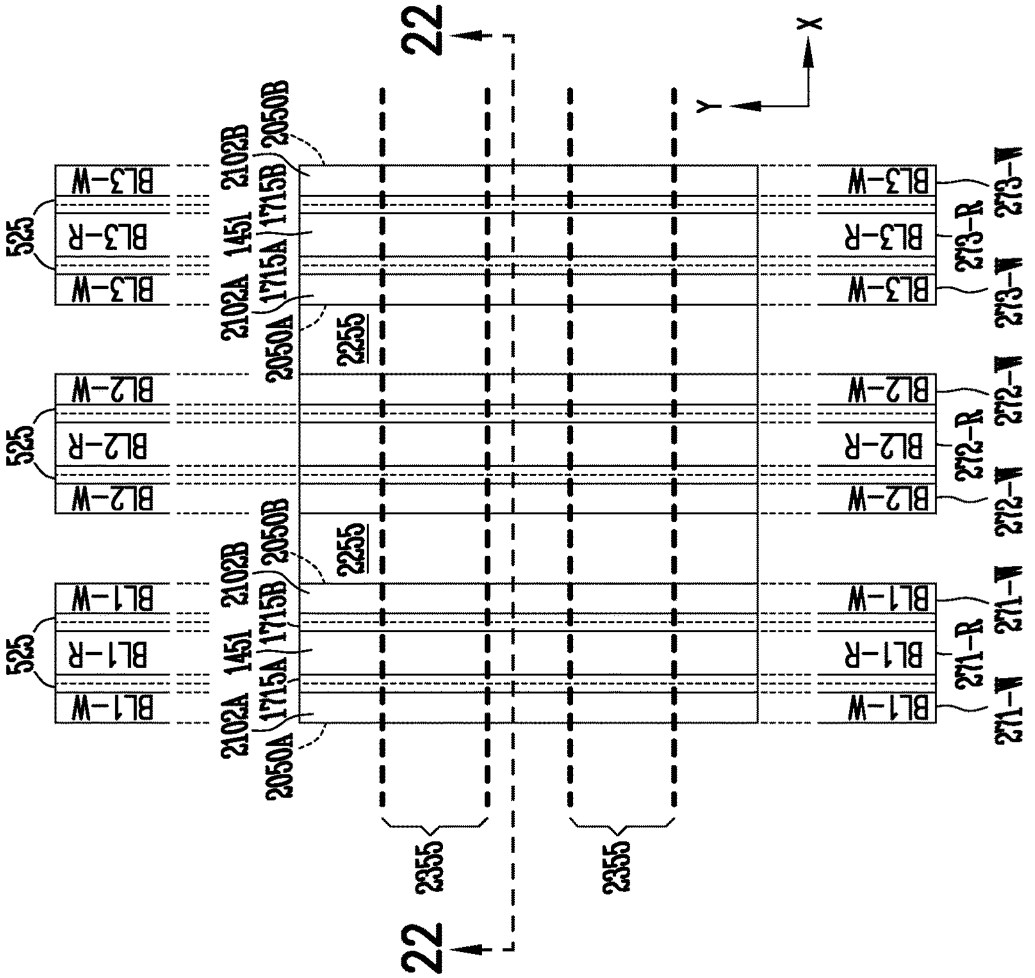

FIG. 23 shows a top view of memory device 200 of FIG. 22. Line 22-22 in FIG. 23 shows the location of a portion (e.g., a cross-section) of memory device 200 shown in FIG. 22. In FIG. 23, portions 2355 will be removed (e.g., cut) in the processes associated with FIG. 24. Each of portions 2355 in FIG. 23 includes a portion of dielectric material 2255, a portion of materials 2102A and 2102B, a portion of materials 2050A and 2050B, a portion of material 1451, and a portion of dielectric materials 1715A and 1715B.

Figure 24:
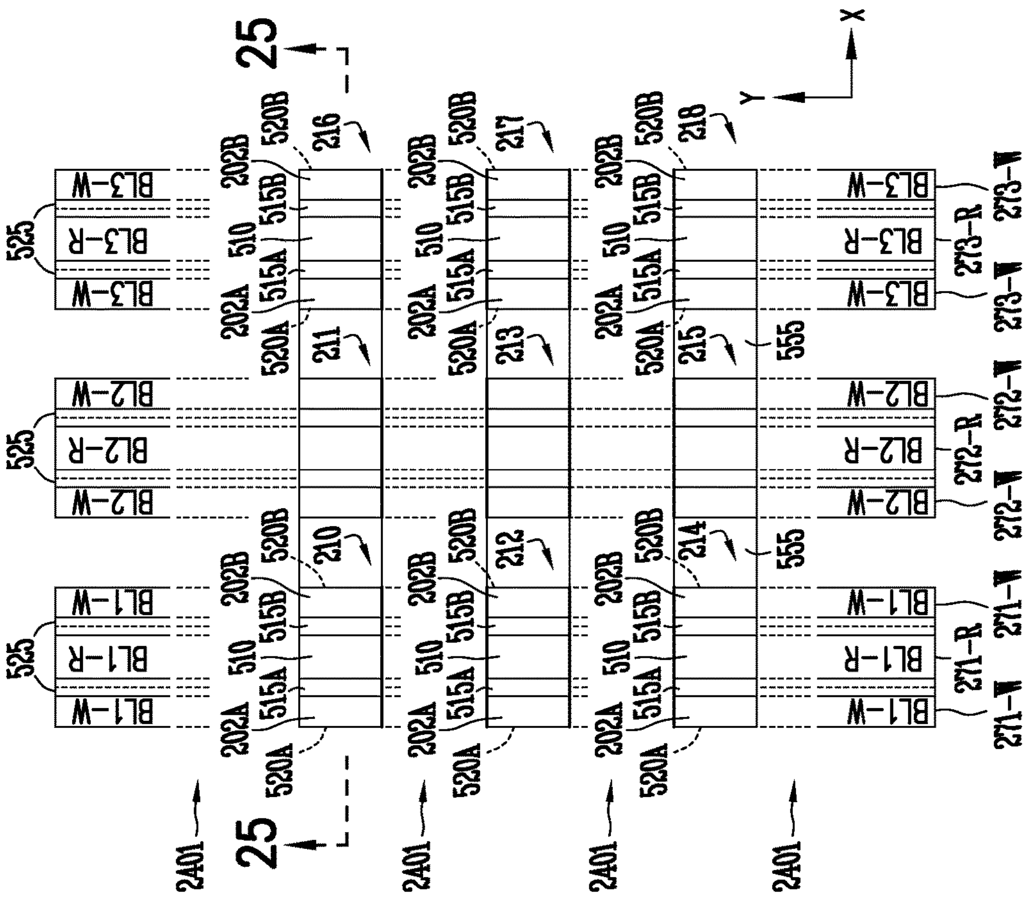

FIG. 24 shows memory device 200 after portions 2355 in FIG. 23 are removed. Trenches 2401 are formed at the locations of portions 2355 that were removed. Removing portions 2355 (FIG. 23) includes removing (at the location of portions 2355 in FIG. 23) a portion of dielectric material 2255, a portion of materials 2102A and 2102B, and a portion of materials 2050A and 2050B. As shown in FIG. 24, the remaining portion of materials 2102A and 2102B form portions (e.g., charge storage portions) 202A and 202B. The remaining portion of materials 2050A and 2050B form portions (e.g., write channel portions) 520A and 520B. The remaining portion of material 1451 form materials (read channel regions) 510. The remaining portion of dielectric materials 1715A and 1715B form dielectric portions 515A and 515B. Line 25-25 in FIG. 24 shows the location of a portion (e.g., a cross-section) of memory device 200 shown in FIG. 25.

Figure 25:
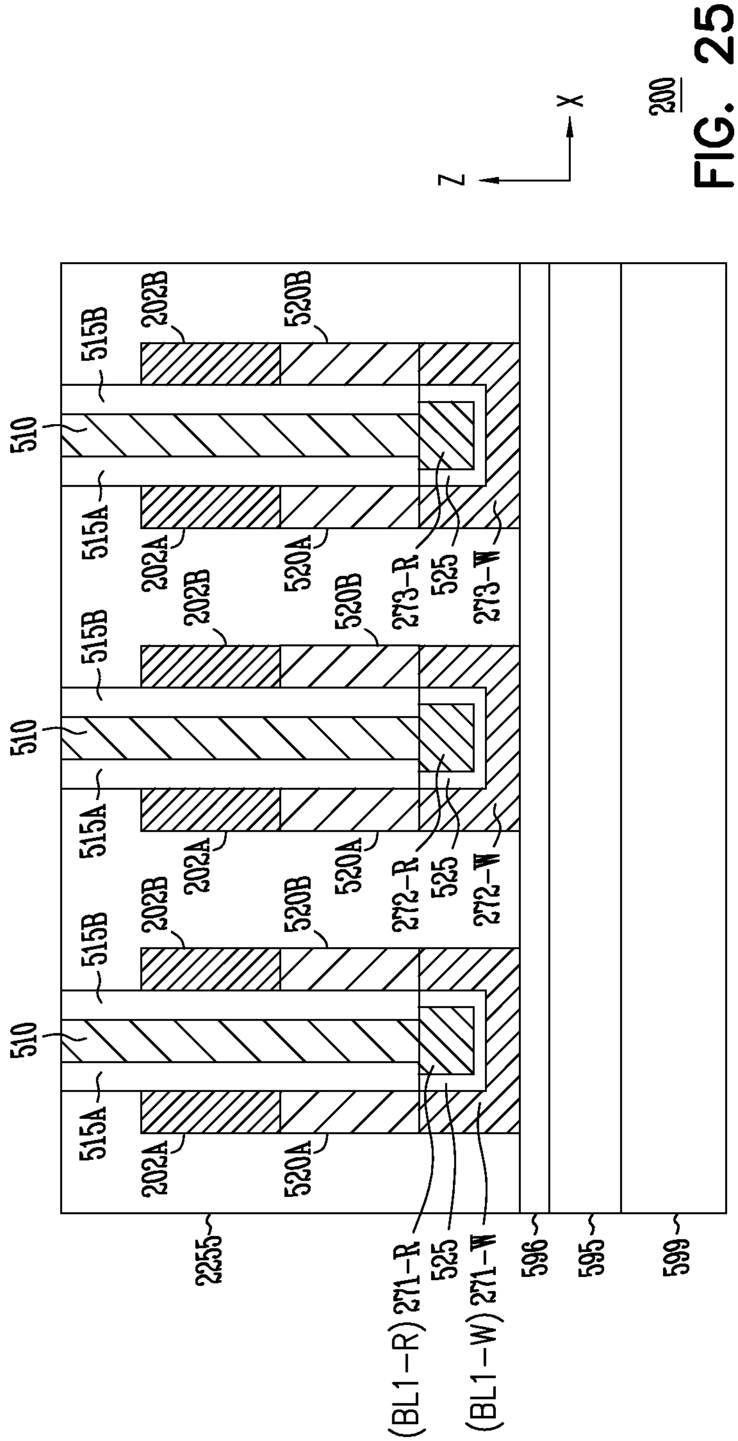

FIG. 25 shows the portion (e.g., a cross-section) of memory device 200 along line 25-25 of FIG. 24.

Figure 26:
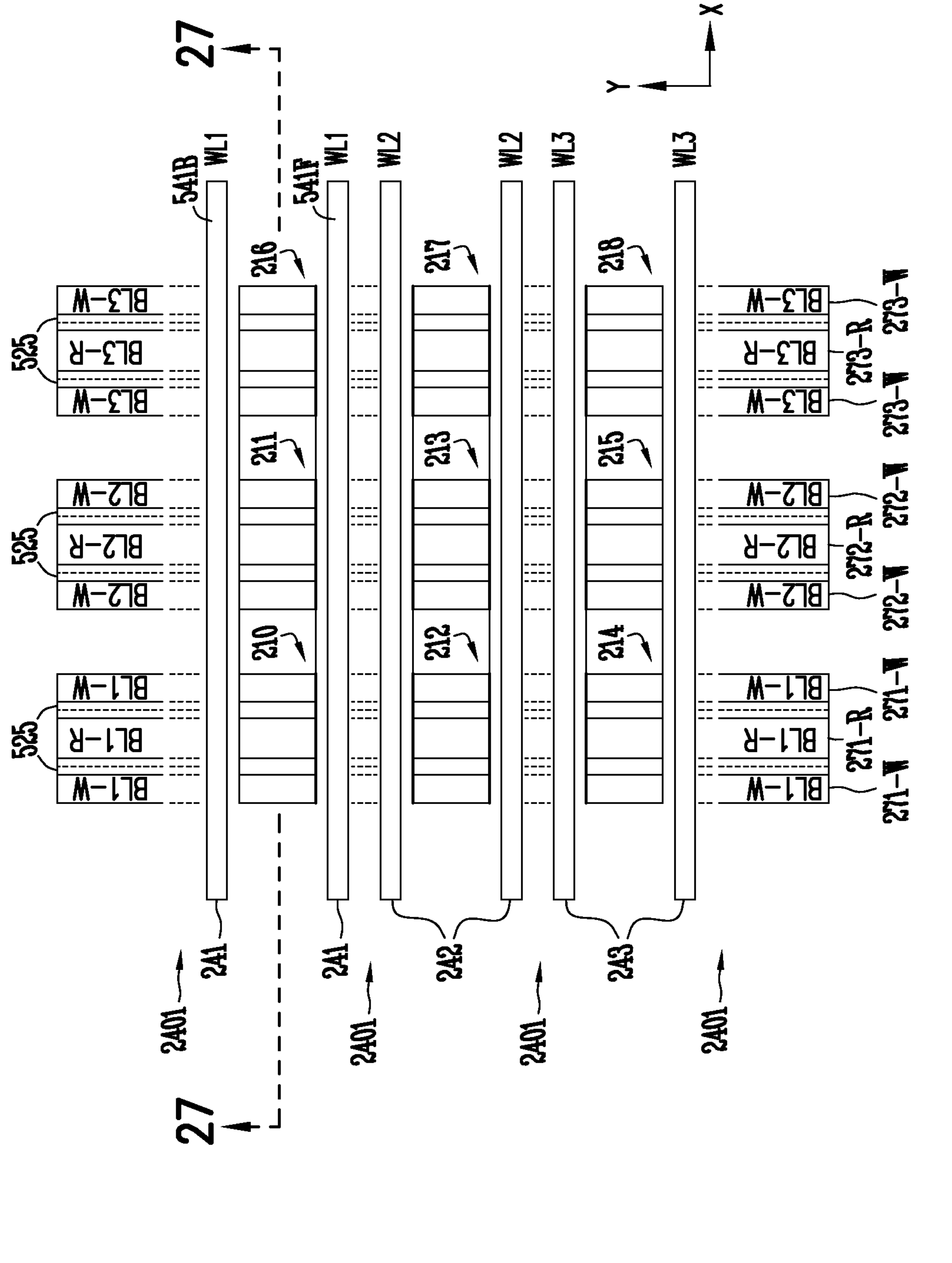

FIG. 26 show a top view (like FIG. 24) of memory device 200 after access lines 241, 242, and 243 are formed in respective trenches 2401. Each of access lines 241, 242, and 243 can include a respective portion formed in one of trenches 2401. For example, access line 241 can include portion 541F and 541B. Line 27-27 in FIG. 26 shows the location of a portion (e.g., a cross-section) of memory device 200 shown in FIG. 26. The processes associated with FIG. 26 can also include forming dielectric materials (e.g., gate oxide regions) 545 (shown in FIG. 9) to electrically separate portions 541F and 541B of access line 241 (and similar portions of access lines 242 and 243) from other elements of respective memory cells 210, 211, and 212. For simplicity, dielectric materials 545 (shown in FIG. 9) are omitted from FIG. 26.

Figure 27:
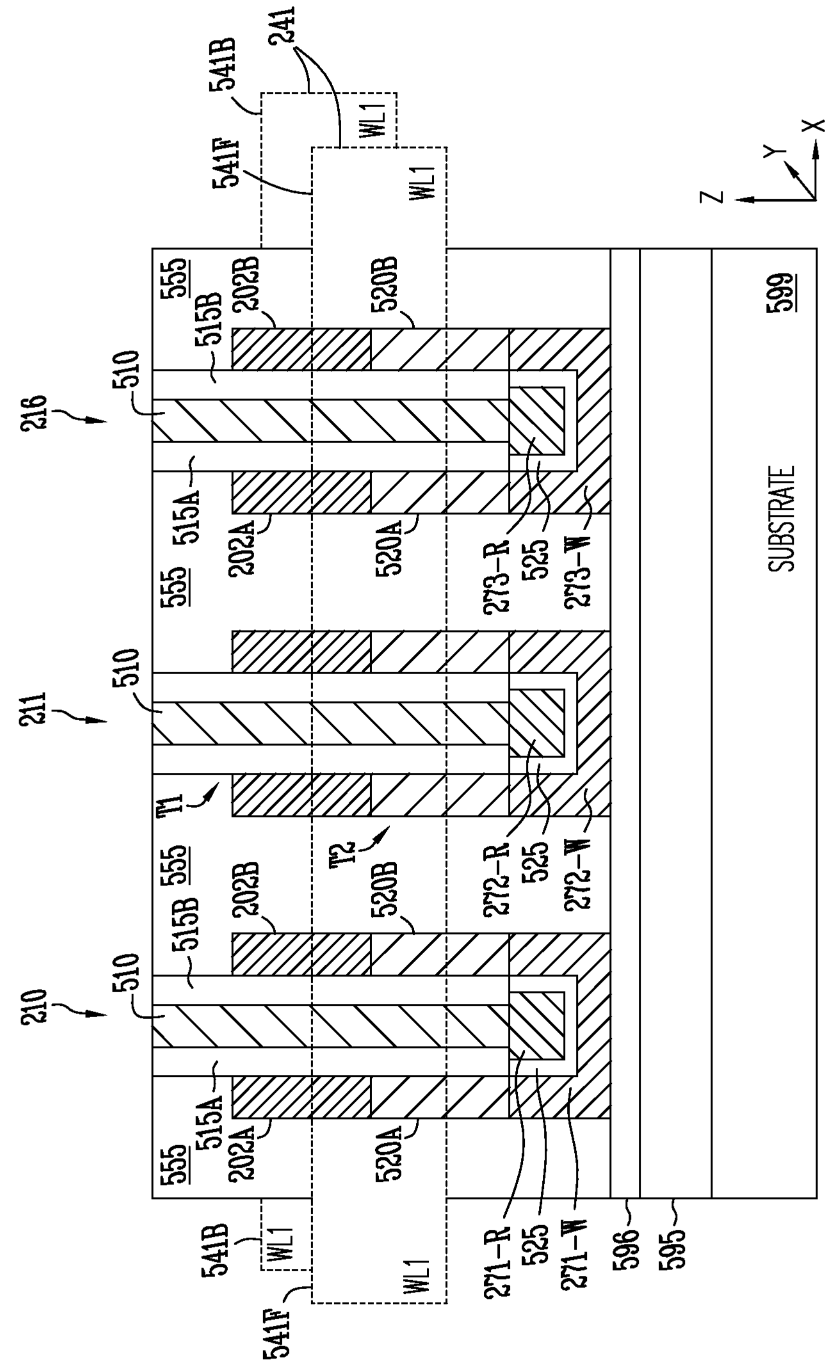

FIG. 27 shows the portion (e.g., a cross-section) of memory device 200 along line 27-27 of FIG. 26.

Figure 28:
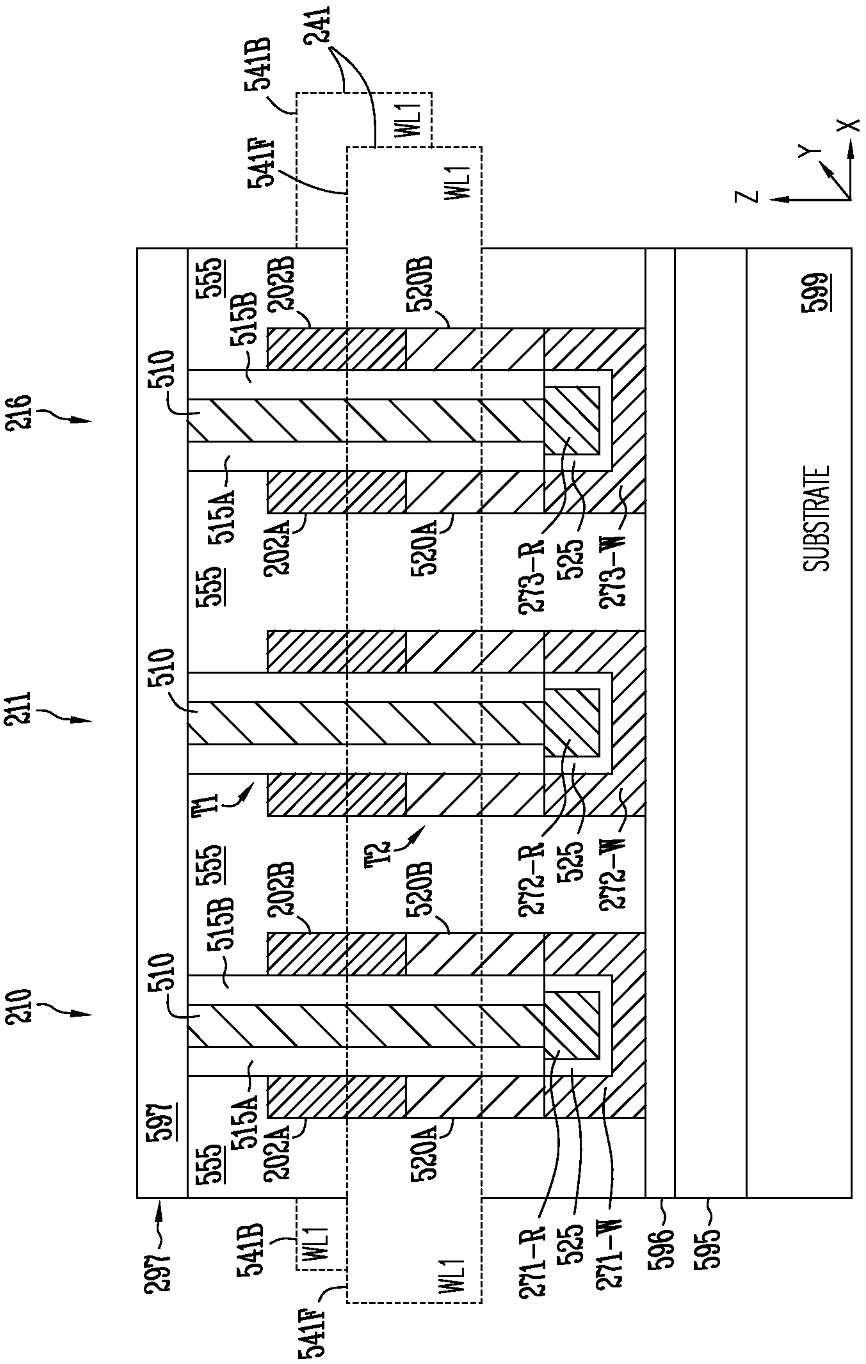

FIG. 28 shows memory device 200 after conductive material 597 is formed over and electrically coupled to material (e.g., read channel region) 510 of respective memory cells 210, 211, and 216.

The description above with reference to FIG. 10 through FIG. 28 describes the processes of forming memory device 200 including the read and write data lines (e.g., data lines 271-R, 271-W, 272-R, 272-W, 273-R, and 273-W) and the memory cells (e.g., memory cells 210 through 218) in which the materials for the read and write data lines can be formed before the materials for the memory cells are formed. This in part allows the structure of the read and write data lines to have a relatively compact structure that can improve scaling and the size of memory device 200.

The description of forming memory device 200 with reference to FIG. 10 through FIG. 28 can include other processes to form a complete memory device. Such processes are omitted from the above description so as to not obscure the subject matter described herein.

Figure 29A:
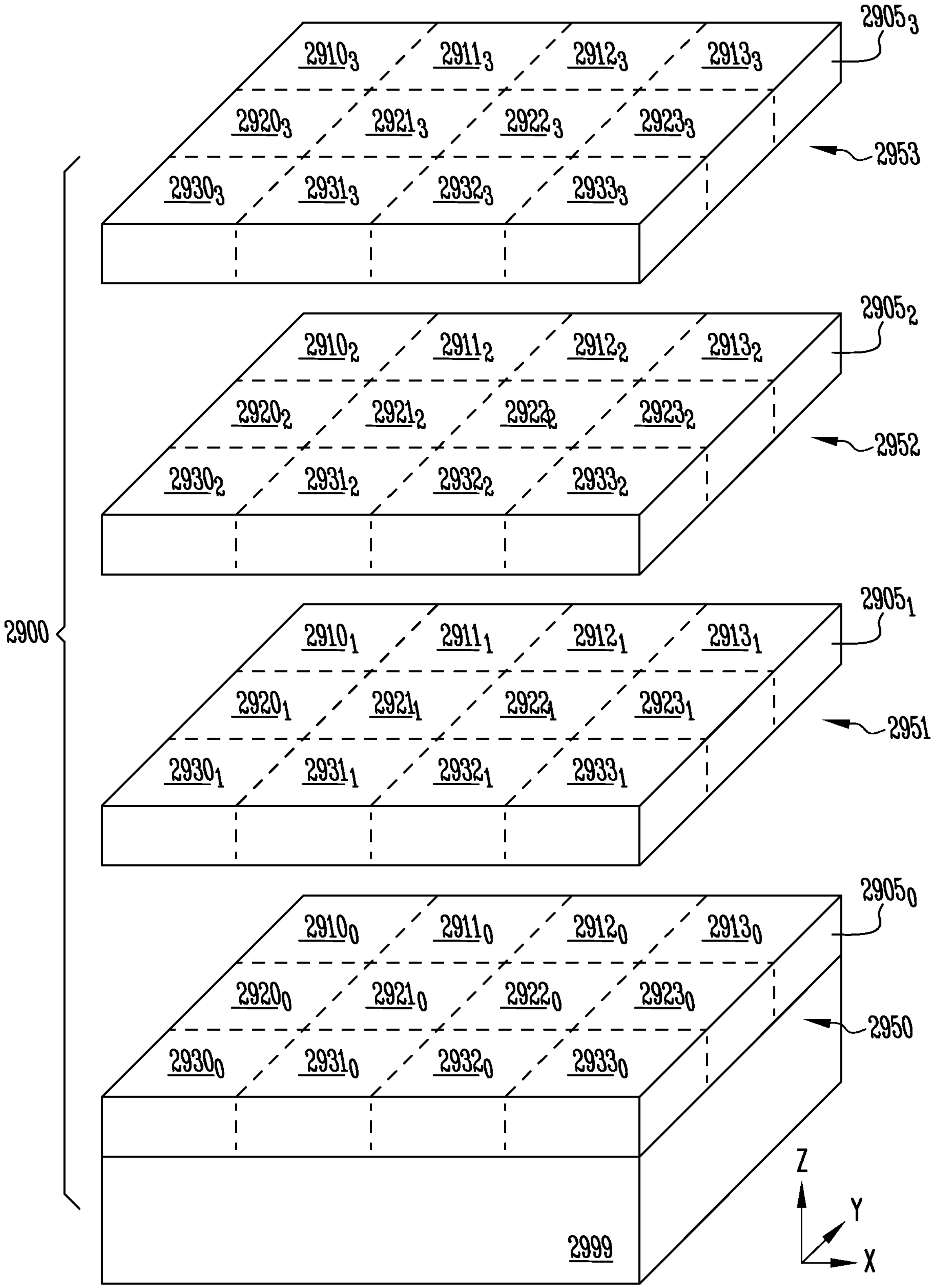
FIG. 29A, FIG. 29B, and FIG. 29C show different views of a structure of a memory device including multiple decks of memory cells, according to some embodiments described herein.
Figure 29B:
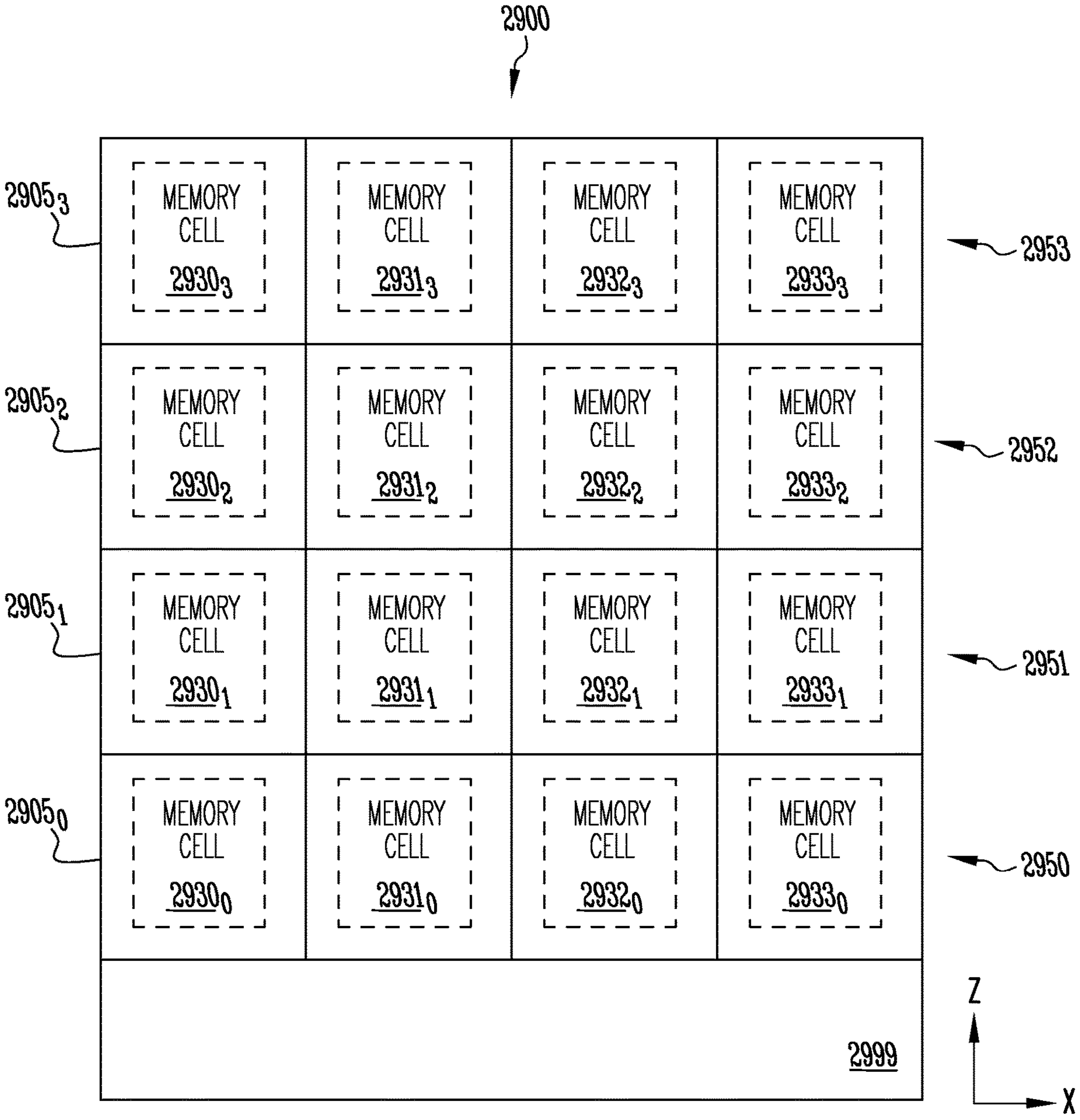
Figure 29C:
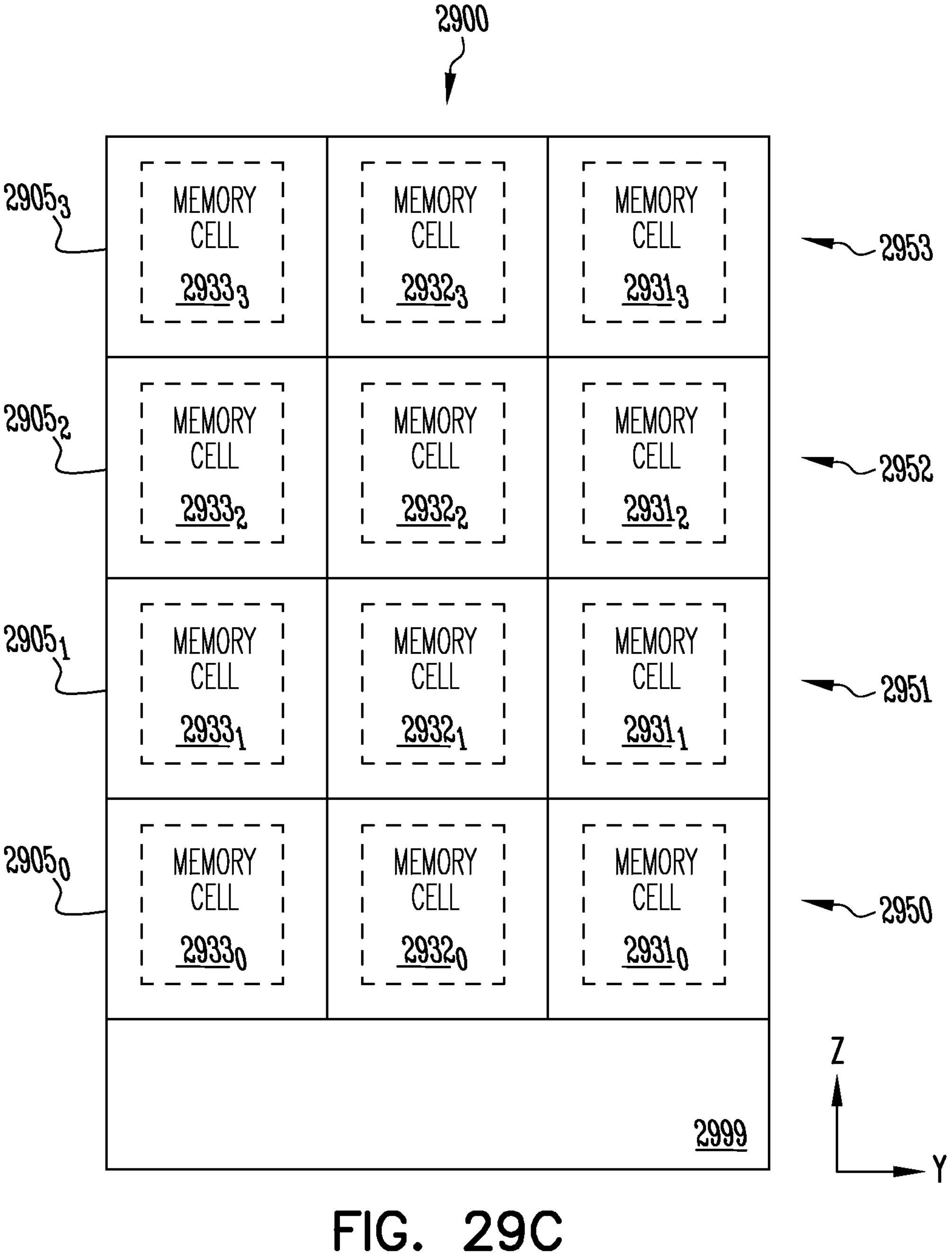

FIG. 29A, FIG. 29B, and FIG. 29C show different views of a structure of a memory device 2900 including multiple decks of memory cells, according to some embodiments described herein. FIG. 25A shows an exploded view (e.g., in the Z-direction) of memory device 2900. FIG. 25B shows a side view (e.g., cross-sectional view) in the X-direction and the Z-direction of memory device 2900. FIG. 29C shows a side view (e.g., cross-sectional view) in the Y-direction and the Z-direction of memory device 2900.

As shown in FIG. 29A, FIG. 29B, and FIG. 29C, memory device 2900 can include decks (decks of memory cells) 2905$_0$, 2905$_1$, 2905$_2$, and 2905$_3$ that are shown separately from each other in an exploded view to help ease of viewing the deck structure of memory device 2900. In reality, decks 2905$_0$, 2905$_1$, 2905$_2$, and 2905$_3$ can be attached to each other in an arrangement where one deck can be formed (e.g., stacked) over another deck over a substrate (e.g., a semiconductor (e.g., silicon) substrate) 2999. For example, as shown in FIG. 29A, decks 2905$_0$, 2905$_1$, 2905$_2$, and 2905$_3$ can be formed in the Z-direction perpendicular to substrate 2999 (e.g., formed vertically in the Z-direction with respect to substrate 2999).

As shown in FIG. 29A, FIG. 29B, and FIG. 29C, each of decks 2905$_0$, 2905$_1$, 2905$_2$, and 2905$_3$ can have memory cells arranged in the X-direction and the Y-direction (e.g., arranged in rows in the X-direction and in columns in the Y-direction). For example, deck 2905$_0$ can include memory cells 2910$_0$, 2911$_0$, 2912$_0$, and 2913$_0$ (e.g., arranged in a row), memory cells 2920$_0$, 2921$_0$, 2922$_0$, and 2923$_0$ (e.g., arranged in a row), and memory cells 2930$_0$, 2931$_0$, 2932$_0$, and 2933$_0$ (e.g., arranged in a row).

Deck 2905$_1$ can include memory cells 2910$_1$, 2911$_1$, 2912$_1$, and 2913$_1$ (e.g., arranged in a row), memory cells 2920$_1$, 2921$_1$, 2922$_1$, and 2923$_1$ (e.g., arranged in a row), and memory cells 2930$_1$, 2931$_1$, 2932$_1$, and 2933$_1$ (e.g., arranged in a row).

Deck 2905$_2$ can include memory cells 2910$_2$, 2911$_2$, 2912$_2$, and 2913$_2$ (e.g., arranged in a row), memory cells 2920$_2$, 2921$_2$, 2922$_2$, and 2923$_2$ (e.g., arranged in a row), and memory cells 2930$_2$, 2931$_2$, 2932$_2$, and 2933$_2$ (e.g., arranged in a row).

Deck 2905$_3$ can include memory cells 2910$_3$, 2911$_3$, 2912$_3$, and 2913$_3$ (e.g., arranged in a row), memory cells 2920$_3$, 2921$_3$, 2922$_3$, and 2923$_3$ (e.g., arranged in a row), and memory cells 2930$_3$, 2931$_3$, 2932$_3$, and 2933$_3$ (e.g., arranged in a row).

As shown in FIG. 29A, FIG. 29B, and FIG. 29C, decks 2905$_0$, 2905$_1$, 2905$_2$, and 2905$_3$ can be located (e.g., formed vertically in the Z-direction) on levels (e.g., portions) 2950, 2951, 2952, and 2953, respectively, of memory device 2900. The arrangement of decks 2905$_0$, 2905$_1$, 2905$_2$, and 2905$_3$ forms a 3-D structure of memory cells of memory device 2900 in that different levels of the memory cells of memory device 2900 can be located (e.g., formed) in different levels (e.g., different vertical portions) 2950, 2951, 2952, and 2953 of memory device 2900.

Decks 2905$_0$, 2905$_1$, 2905$_2$, and 2905$_3$ can be formed one deck at a time. For example, decks 2905$_0$, 2905$_1$, 2905$_2$, and 2905$_3$ can be formed sequentially in the order of decks 2905$_0$, 2905$_1$, 2905$_2$, and 2905$_3$ (e.g., deck 2905$_1$ is formed first and deck 2905$_3$ is formed last). In this example, the memory cell of one deck (e.g., deck 2905$_1$) can be formed either after formation of the memory cells of another deck (e.g., deck 2905$_0$) or before formation of the memory cells of another deck (e.g., deck 2905$_2$). Alternatively, decks 2905$_0$, 2905$_1$, 2905$_2$, and 2905$_3$ can be formed concurrently (e.g., simultaneously), such that the memory cells of decks 2905$_0$, 2905$_1$, 2905$_2$, and 2905$_3$ can be concurrently formed. For example, the memory cells in levels 2950, 2951, 2952, and 2953 of memory device 2900 can be concurrently formed.

The structures decks 2905$_0$, 2905$_1$, 2905$_2$, and 2905$_3$ can include the structures of memory devices described above with reference to FIG. 1 through FIG. 28.

Memory device 2900 can include data lines (e.g., bit lines) and access lines (e.g., word lines) to access the memory cells of decks 2905$_0$, 2905$_1$, 2905$_2$, and 2905$_3$. For simplicity, data lines and access lines of memory cells are omitted from FIG. 29A. However, the data lines and access lines of memory device 2900 can be similar to the data lines and access lines, respectively, of the memory devices described above with reference to FIG. 1 through FIG. 28.

FIG. 29A, FIG. 29B, and FIG. 29C show memory device 2900 including four decks (e.g., 2905$_0$, 2905$_1$, 2905$_2$, and 2905$_3$) as an example. However, the number of decks can be different from four. FIG. 29A shows each of decks 2905$_0$, 2905$_1$, 2905$_2$, and 2905$_3$ including one level (e.g., layer) of memory cells as an example. However, at least one of the decks (e.g., one or more of decks 2905$_0$, 2905$_1$, 2905$_2$, and 2905$_3$) can have two (or more) levels of memory cells. FIG. 29A shows an example where each of decks 2905$_0$, 2905$_1$, 2905$_2$, and 2905$_3$ includes four memory cells (e.g., in a row) in the X-direction and three memory cells (e.g., in a column) in the Y-direction. However, the number of memory cells in a row, in a column, or both, can vary. Since memory device 2900 can include the structures of memory devices 200, memory device 2900 can also have improvements and benefits like memory devices 200.

The illustrations of apparatuses (e.g., memory devices 100, 200, and 2900) and methods (e.g., methods of forming memory device 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 2900) or a system (e.g., an electronic item that can include any of memory devices 100, 200, and 2900).

Any of the components described above with reference to FIG. 1 through FIG. 25C can be implemented in a number of ways, including simulation via software. Thus, apparatuses (e.g., memory devices 100, 200, and 2900) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, and 2900) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 25C include apparatuses and methods of operating the apparatuses. One of the apparatuses includes a first data line; a second data line adjacent the first data line and separated from the first data line by a first dielectric structure; and a memory cell formed over the first and second data lines. The memory cell includes a first transistor including a first channel region formed over and coupled to the first data line, and a charge storage structure separated from the first channel region; a second transistor including a second channel region formed over and coupled to the second data line, wherein the charge storage structure is formed over and coupled to the second channel region; and a second dielectric structure between the first channel region and each of the second channel region and the charge storage structure. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

a first data line;

a second data line adjacent the first data line and separated from the first data line by a first dielectric structure; and a memory cell formed over the first and second data lines, the memory cell including:

a first transistor including a first channel region formed over and coupled to the first data line, and a charge storage structure separated from the first channel region, wherein a direction from the first channel region to the first data line is parallel to a direction from the first data line to a portion of the second data line;

a second transistor including a second channel region formed over and coupled to the second data line, wherein the charge storage structure is formed over and coupled to the second channel region; and a second dielectric structure between the first channel region and each of the second channel region and the charge storage structure.

2. The apparatus of claim 1, wherein the charge storage structure includes:

a first portion contacting a first portion of the second channel region and electrically separated from a first side of the first channel region; and a second portion contacting a second portion of the second channel region and electrically separated from a second side of the first channel region.

3. The apparatus of claim 1, wherein the second channel region includes:

a first portion formed over a first portion of the second data line; and a second portion formed over a second portion of the second data line, and wherein the second portion of the second channel is separated from the first portion of the second channel by a portion of the second dielectric structure.

4. The apparatus of claim 1, wherein the first channel region and the second channel region have different conductivity types.

5. The apparatus of claim 1, wherein the first channel region includes a piece of semiconductor material.

6. The apparatus of claim 1, wherein the second channel region includes a piece of semiconducting oxide material.

7. The apparatus of claim 1, wherein the charge storage structure includes a piece of titanium nitride.

8. The apparatus of claim 1, wherein the first and second dielectric structures have different dielectric materials.

9. The apparatus of claim 1, further comprising a conductive region separated from the first channel region and the second channel region, wherein the conductive region forms a gate of the first transistor and a gate of the second transistor.

10. An apparatus comprising:

a first data line;

a second data line, the first data line formed over at least a portion of the second data line and separated from the second data line by a first dielectric structure adjacent the first and second data lines; and a memory cell coupled to the first and second data lines, the memory cell including:

a first material formed over and electrically coupled to the first data line;

a second material formed over and electrically coupled to the second data line;

a memory element formed over and electrically coupled to the second material and electrically separated from the first material and the first data line; and a second dielectric structure separating the first material from the second material and the memory element.

11. The apparatus of claim 10, wherein the first material and the second material have different conductivity types.

12. The apparatus of claim 10, wherein the first dielectric structure includes a dielectric material different from silicon dioxide.

13. The apparatus of claim 10, wherein the first material includes a semiconductor material having dopant grading and activated.

14. The apparatus of claim 10, wherein the second material includes at least one of zinc tin oxide (ZTO), indium zinc oxide (IZO), zinc oxide (ZnOx), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnyInzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

15. The apparatus of claim 10, further comprising a conductive region contacting the first material and electrically separated from the second material.

16. The apparatus of claim 15, wherein the first material is structured to conduct current between the data line and the conductive region.

17. The apparatus of claim 1, wherein the second material is structured to conduct current between the second data line and the memory element.

* * * * *